(12) United States Patent
Aichi

(10) Patent No.: US 8,766,337 B2
(45) Date of Patent: Jul. 1, 2014

(54) SEMICONDUCTOR DEVICE AND METHOD FOR MANUFACTURING THE SAME

(75) Inventor: Hiroshi Aichi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 65 days.

(21) Appl. No.: 13/512,034

(22) PCT Filed: Nov. 24, 2010

(86) PCT No.: PCT/JP2010/070889
§ 371 (c)(1),
(2), (4) Date: Jun. 8, 2012

(87) PCT Pub. No.: WO2011/065362
PCT Pub. Date: Jun. 3, 2011

(65) Prior Publication Data
US 2012/0241825 A1    Sep. 27, 2012

(30) Foreign Application Priority Data
Nov. 27, 2009    (JP) ................. 2009-270556

(51) Int. Cl.
| | |
|---|---|
| H01L 31/062 | (2012.01) |
| H01L 27/146 | (2006.01) |
| G02F 1/1368 | (2006.01) |
| H01L 29/786 | (2006.01) |
| G06F 3/041 | (2006.01) |

(52) U.S. Cl.
CPC ........ *G02F 1/1368* (2013.01); *H01L 27/14623* (2013.01); *H01L 27/14621* (2013.01); *H01L 29/78633* (2013.01); *G06F 3/0412* (2013.01); *H01L 27/14645* (2013.01)
USPC ............... 257/290; 257/701; 257/58; 257/72; 257/59; 257/43; 257/26; 438/166; 438/479; 438/149; 438/30; 438/22

(58) Field of Classification Search
USPC ............. 257/290, 701, 58, 72, 59, 79, 40, 53, 257/43, 26; 438/166, 479, 149, 30, 22
See application file for complete search history.

(56) References Cited

U.S. PATENT DOCUMENTS 5,501,989 A    3/1996    Takayama et al.
(Continued)

FOREIGN PATENT DOCUMENTS

JP    62-186559 A    8/1987
(Continued)

OTHER PUBLICATIONS

Official Communication issued in International Patent Application No. PCT/JP2010/070889, mailed on Dec. 28, 2010.
(Continued)

*Primary Examiner* — Fernando L. Toledo
*Assistant Examiner* — Mohammed Shamsuzzaman
(74) *Attorney, Agent, or Firm* — Keating & Bennett, LLP

(57) ABSTRACT

A first thin film diode (100A) has a first semiconductor layer (10A) and a first light blocking layer (12A) disposed on the substrate side of the first semiconductor layer. A second thin film diode (100B) has a second semiconductor layer (10B) and a second light blocking layer (12B) disposed on the substrate side of the second semiconductor layer. An insulating film (14) is formed between the first semiconductor layer (10A) and the first light blocking layer (12A) and between the second semiconductor layer (10B) and the second light blocking layer (12B). A thickness D1 of a portion of the insulating film (14) positioned between the first semiconductor layer (10A) and the first light blocking layer (12A) is different from a thickness D2 of a portion of the insulating film (14) positioned between the second semiconductor layer (10B) and the second light blocking layer (12B). The intensity of light in a first wavelength region incident on the first semiconductor layer (10A) is higher than the intensity of light in the first wavelength region incident on the second semiconductor layer (10B). The intensity of light in a second wavelength region including a wavelength longer than the maximum wavelength of the first wavelength region incident on the second semiconductor layer (10B) is higher than the intensity of light in the second wavelength region incident on the first semiconductor layer (10A).

9 Claims, 9 Drawing Sheets

(56) References Cited

U.S. PATENT DOCUMENTS

| | | | |
|---|---|---|---|
| 5,643,817 A * | 7/1997 | Kim et al. | 205/124 |
| 6,327,013 B1 * | 12/2001 | Tombling et al. | 349/139 |
| 6,838,324 B2 * | 1/2005 | Yamazaki et al. | 438/149 |
| 6,839,107 B2 * | 1/2005 | Kobashi | 349/113 |
| 6,847,050 B2 * | 1/2005 | Yamazaki et al. | 257/59 |
| 6,900,853 B2 * | 5/2005 | Watanabe et al. | 349/43 |
| 6,960,786 B2 * | 11/2005 | Yamazaki et al. | 257/59 |
| 6,991,315 B2 * | 1/2006 | Nakamura et al. | 347/40 |
| 7,005,671 B2 * | 2/2006 | Yamazaki et al. | 257/40 |
| 7,320,905 B2 * | 1/2008 | Yamazaki et al. | 438/149 |
| 7,440,054 B2 * | 10/2008 | Ozawa et al. | 349/114 |
| 7,455,389 B2 * | 11/2008 | Nakamura et al. | 347/40 |
| 7,471,357 B2 * | 12/2008 | Ahn et al. | 349/114 |
| 7,605,890 B2 * | 10/2009 | Ozawa et al. | 349/114 |
| 7,787,082 B2 * | 8/2010 | Ito et al. | 349/116 |
| 7,804,096 B2 * | 9/2010 | Jiroku | 257/72 |
| 2001/0001073 A1 * | 5/2001 | Yamazaki et al. | 438/166 |
| 2001/0015778 A1 * | 8/2001 | Murade et al. | 349/43 |
| 2002/0018161 A1 * | 2/2002 | Yamanaka et al. | 349/112 |
| 2002/0158573 A1 * | 10/2002 | Kobashi | 313/498 |
| 2003/0011740 A1 * | 1/2003 | Tanaka et al. | 349/177 |
| 2003/0025118 A1 * | 2/2003 | Yamazaki et al. | 257/79 |
| 2003/0147115 A1 * | 8/2003 | Takizawa et al. | 359/263 |
| 2003/0218170 A1 * | 11/2003 | Yamazaki et al. | 257/59 |
| 2004/0026696 A1 * | 2/2004 | Yamazaki et al. | 257/66 |
| 2004/0048408 A1 * | 3/2004 | Hirakata et al. | 438/30 |
| 2004/0094767 A1 * | 5/2004 | Kasahara | 257/72 |
| 2004/0115846 A1 * | 6/2004 | Otake et al. | 438/22 |
| 2004/0155999 A1 * | 8/2004 | Okumura et al. | 349/114 |
| 2004/0165132 A1 * | 8/2004 | Tomioka et al. | 349/123 |
| 2004/0179159 A1 * | 9/2004 | Tanaka et al. | 349/123 |
| 2004/0218122 A1 * | 11/2004 | Nishimura | 349/114 |
| 2005/0116225 A1 * | 6/2005 | Yamazaki et al. | 257/58 |
| 2005/0162597 A1 * | 7/2005 | Wachi | 349/138 |
| 2005/0181547 A1 * | 8/2005 | Asano et al. | 438/149 |
| 2006/0017154 A1 * | 1/2006 | Eguchi et al. | 257/701 |
| 2006/0145164 A1 * | 7/2006 | Illek et al. | 257/79 |
| 2006/0160279 A1 * | 7/2006 | Park et al. | 438/149 |
| 2006/0256266 A1 * | 11/2006 | Tsuchiya et al. | 349/114 |
| 2007/0121041 A1 * | 5/2007 | Nakano et al. | 349/114 |
| 2008/0090344 A1 * | 4/2008 | Kuwabara et al. | 438/166 |
| 2008/0273155 A1 * | 11/2008 | Maeda et al. | 349/143 |
| 2009/0224245 A1 * | 9/2009 | Umezaki | 257/59 |
| 2010/0065851 A1 | 3/2010 | Makita | |
| 2010/0224880 A1 * | 9/2010 | Kimura | 257/59 |
| 2011/0053353 A1 * | 3/2011 | Maekawa et al. | 438/479 |
| 2011/0062433 A1 * | 3/2011 | Yamazaki | 257/43 |
| 2011/0227878 A1 * | 9/2011 | Makita | 345/175 |
| 2011/0281038 A1 * | 11/2011 | Yamazaki et al. | 427/532 |
| 2011/0297936 A1 * | 12/2011 | Makita et al. | 257/53 |
| 2012/0049185 A1 * | 3/2012 | Kimura | 257/43 |
| 2012/0326973 A1 * | 12/2012 | Kita | 345/156 |

FOREIGN PATENT DOCUMENTS

| | | |
|---|---|---|
| JP | 02-055478 A | 2/1990 |
| JP | 06-275807 A | 9/1994 |
| JP | 11-317510 A | 11/1999 |
| JP | 2004-071817 A | 3/2004 |
| JP | 2008-300630 A | 12/2008 |
| JP | 2009-010125 A | 1/2009 |
| JP | 2009-237286 A | 10/2009 |
| WO | 2008/132862 A1 | 11/2008 |

OTHER PUBLICATIONS

English translation of Official Communication issued in corresponding International Application PCT/JP2010/070889, mailed on Jul. 19, 2012.

* cited by examiner

FIG.5
(a)
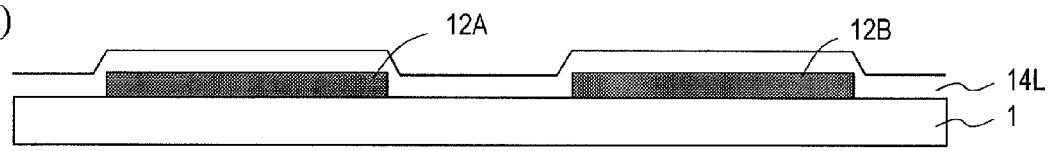
(b)
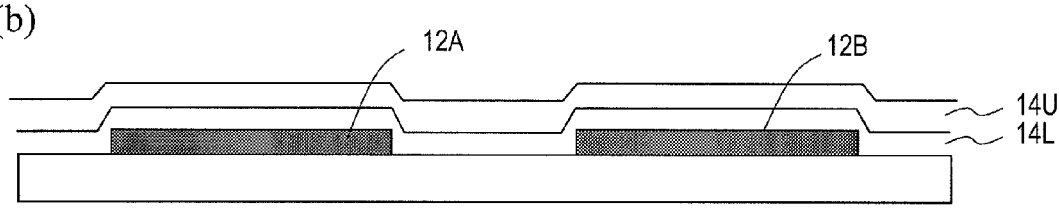
(c)
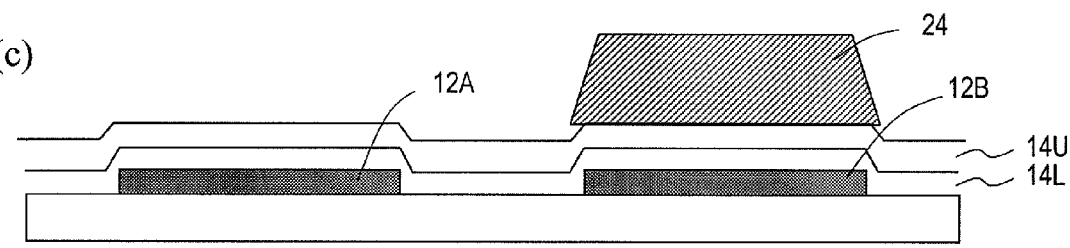
(d)
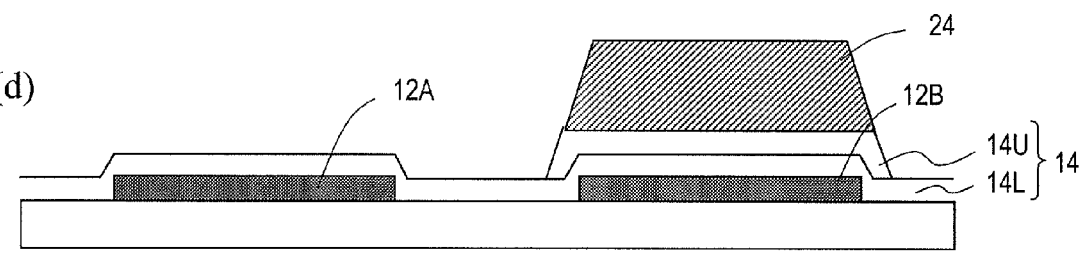
FIG.6
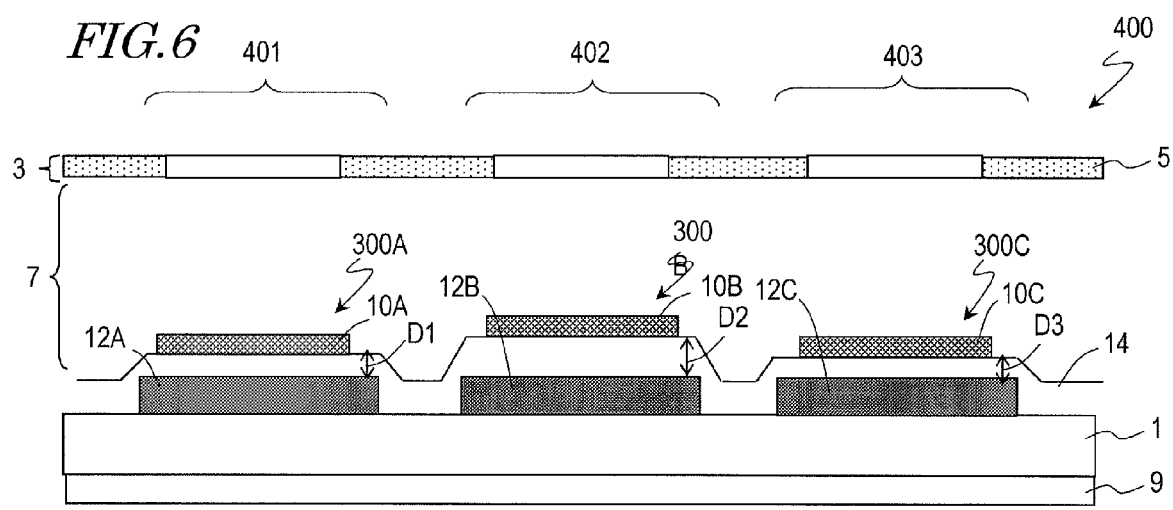

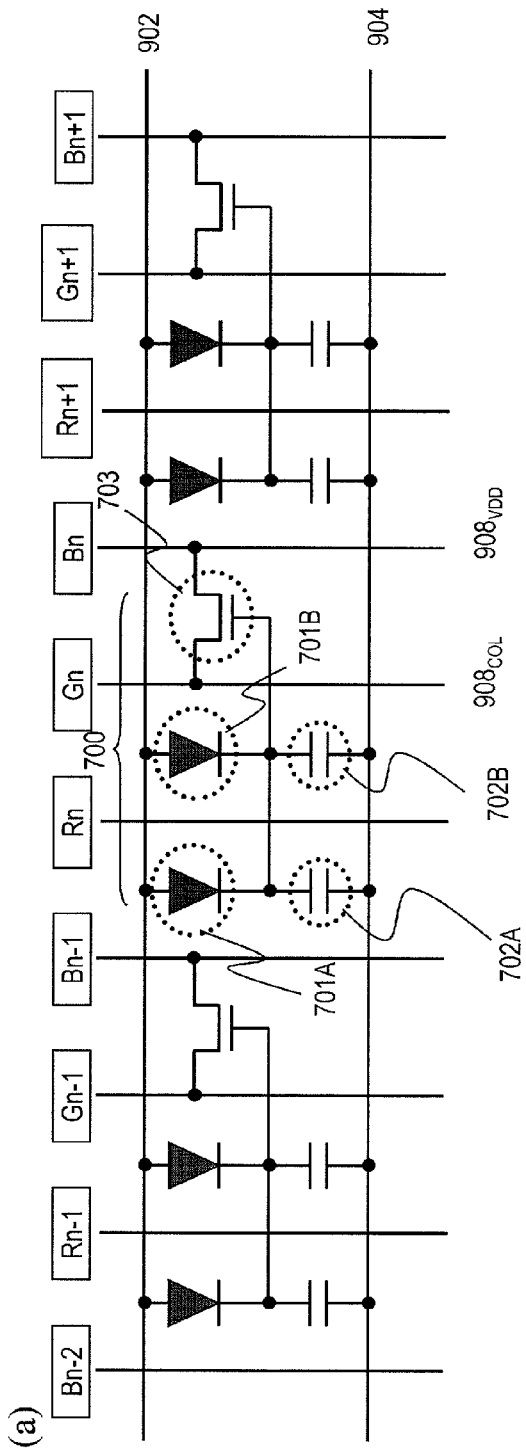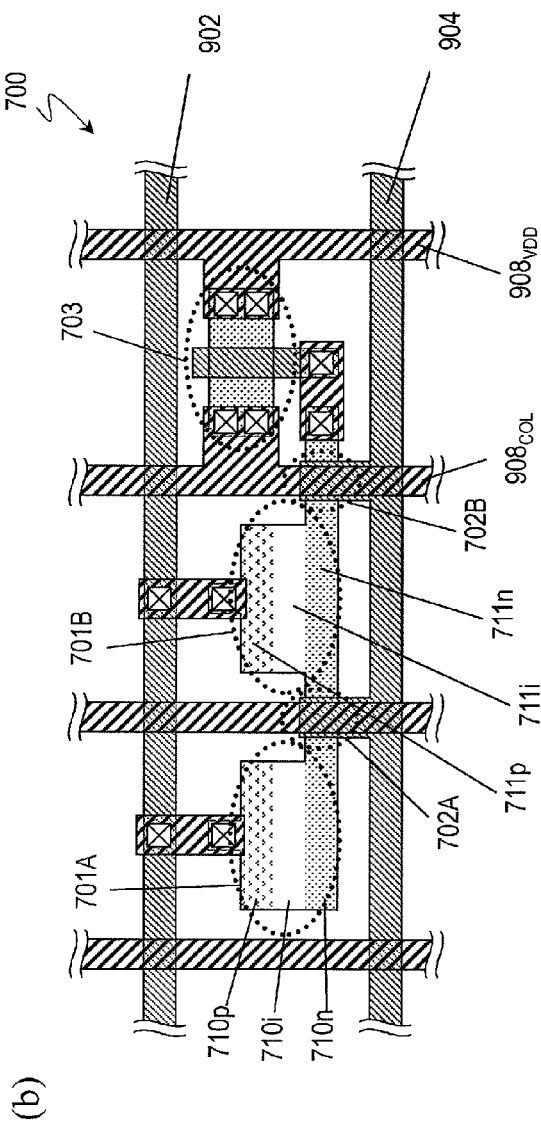
FIG.10

US 8,766,337 B2

SEMICONDUCTOR DEVICE AND METHOD FOR MANUFACTURING THE SAME

TECHNICAL FIELD

The present invention relates to a semiconductor device including a thin film diode (Thin Film Diode: TFD), and a production method thereof.

BACKGROUND ART

In recent years, electronic equipment such as a display device or an image sensor provided with an optical sensor portion utilizing a TFD has been developed.

Patent Document 1 discloses an image sensor in which an optical sensor portion utilizing a TFD and a driving circuit utilizing a thin film transistor (Thin Film Transistor: TFT) are provided on one and the same substrate. Patent Document 2 discloses a display device provided with an optical touch panel. In this display device, an optical sensor portion utilizing a TFD is provided in a display area of a liquid crystal display device, so that an object such as a finger which touches the screen can be detected by utilizing ambient light. In addition, Patent Document 3 discloses a display device provided with an optical touch panel in which an object such as a finger which touches the screen can be detected by utilizing not only ambient light incident on the display panel but also reflected light of light from a backlight.

In the above-described display devices or in the image sensors, the TFD is formed by utilizing a low-temperature poly-silicon film, for example. In this case, since a semiconductor layer (the low-temperature poly-silicon layer) of the TFD is thin, the semiconductor layer of the TFD cannot sufficiently absorb light having relatively longer wavelength (e.g. red light) and there is some possibility that high sensitivity cannot be attained. It is considered that the semiconductor layer of the TFD is made thicker. However, if the semiconductor layer is made thicker, the process for crystallizing an amorphous silicon film by laser crystallization or other means functions as the rate-limiting factor. Accordingly, in view of the productivity, it is difficult to greatly increase the thickness of the semiconductor layer of the TFD.

Therefore, conventionally, in order to improve effective sensitivity of an optical sensor utilizing a TFD, it is necessary to increase the area of the light receiving region by arranging a large number of diodes in parallel on a substrate. However, if such a configuration is applied in a touch panel type display device, a large number of diodes are arranged in the pixel area, thereby significantly deteriorating the display characteristics.

On the contrary, Patent Document 4 suggests that a reflecting film is disposed via an insulating film below the semiconductor layer of the TFD, and that the thickness of the insulating film is optimized so as to increase the reflectance of light having long wavelength (red light). Due to the suggestions, the document describes that it is possible to increase the sensitivity of optical sensor to the red light.

CITATION LIST

Patent Literature

Patent Document 1: Japanese Laid-Open Patent Publication No. 6-275807
Patent Document 2: International Publication WO 2008/132862
Patent Document 3: Japanese Laid-Open Patent Publication No. 2009-237286
Patent Document 4: Japanese Laid-Open Patent Publication No. 2004-71817

SUMMARY OF INVENTION

Technical Problem

In a display device provided with an optical sensor portion, in addition to a TFD used in the optical sensor portion, a TFT for pixel switching and a TFT for a driving circuit are sometimes formed on one and the same substrate. Especially, in a display device having a touch panel function or a scanner function, or in a display device having both of the functions, two types of TFDs in which the detectable light wavelength regions are different are sometimes formed on one and the same substrate. For example, if a TFD for detecting visible light, a TFD for detecting infrared rays from a backlight, and a TFT are formed on one and the same substrate, the sensing of an object or an image which is in contact with the screen can be performed by utilizing not only the ambient light (visible light) incident on the display panel, but also the infrared rays emitted from the backlight. In such a display device, if a plurality of kinds of TFDs and TFTs are to be simultaneously formed on the substrate, it is difficult to individually optimize the device properties required for the TFDs and the TFTs.

The above-mentioned problem will be specifically described by way of an example of a touch panel type display device provided with a visible light sensor for detecting visible light, and an infrared-ray sensor for detecting infrared rays. In the display device, a TFD used for the visible light sensor (a first TFD) and a TFD used for the infrared-ray sensor (a second TFD) are formed on one and the same substrate. At this time, if the structure suggested in Patent Document 4 is applied to the first TFD, a reflecting structure including a reflecting film and an insulating film which are the same as the first TFD is formed below the semiconductor layers of the second TFD and the TFT. As a result, sufficient infrared rays are not incident on the second TFD, thereby degrading the sensitivity of the infrared-ray sensor, or the visible light is incident on the semiconductor layer of the TFT, so that there is some possibility that an off-current of the TFT may be increased.

A conventional display device does not specifically take effective countermeasures for increasing the sensitivity to infrared rays. Such countermeasures as that the sensitivity of infrared-ray sensor is increased by increasing the intensity of illumination of a backlight which emits light including infrared rays (referred to as an "IR backlight") are carried out, but they may result in the increase in power consumption of backlight.

The present invention has been conducted in view of the above-described problems, and the objective of the present invention is to provide a semiconductor device including a first thin film diode for detecting light in a first wavelength region and a second thin film diode for detecting light in a second wavelength region on one and the same substrate in which the sensitivity of a sensor including the first thin film diode with respect to the light in the first wavelength region and the sensitivity of a sensor including the second thin film diode with respect to the light in the second wavelength region are both obtained sufficiently.

Solution to Problem

The semiconductor device of the present invention is a semiconductor device including: a substrate; and a first thin film diode and a second thin film diode supported by the substrate, wherein the first thin film diode includes a first semiconductor layer and a first light blocking layer disposed on the substrate side of the first semiconductor layer, the second thin film diode includes a second semiconductor layer and a second light blocking layer disposed on the substrate side of the second semiconductor layer, an insulating film is formed between the first semiconductor layer and the first light blocking layer and between the second semiconductor layer and the second light blocking layer, a thickness D1 of a portion of the insulating film positioned between the first semiconductor layer and the first light blocking layer is different from a thickness D2 of a portion of the insulating film positioned between the second semiconductor layer and the second light blocking layer, light in a first wavelength region and light in a second wavelength region including a wavelength longer than the maximum wavelength of the first wavelength region are incident on the first and the second semiconductor layers, the first and the second light blocking layers have surfaces for reflecting the light in the first and the second wavelength regions, the intensity of light in the first wavelength region incident on the first semiconductor layer is higher than the intensity of light in the first wavelength region incident on the second semiconductor layer, and the intensity of light in the second wavelength region incident on the second semiconductor layer is higher than the intensity of light in the second wavelength region incident on the first semiconductor layer.

In one preferred embodiment, the thickness D1 of the portion of the insulating film positioned between the first semiconductor layer and the first light blocking layer is smaller than the thickness D2 of the portion of the insulating film positioned between the second semiconductor layer and the second light blocking layer.

In one preferred embodiment, the light in the first wavelength region includes visible light, and the light in the second wavelength region includes infrared rays.

Preferably, the first semiconductor layer and the second semiconductor layer are formed by using one and the same semiconductor film.

The insulating film may include: a lower film, made from a first insulating material, which is formed to cover the first and the second semiconductor layers; and an upper film, made from a second insulating material which is different from the first insulating material, which is formed on the lower film to cover the second semiconductor layer but not to cover the first semiconductor layer.

Alternatively, the insulating film may include: a lower film, made from a first insulating material, which is formed to cover the second semiconductor layer but not to cover the first semiconductor layer; and an upper film, made from a second insulating material which is the same as or different from the first insulating material, which is formed on the lower film to cover the first and the second semiconductor layers.

In one preferred embodiment, the thickness D1 and the thickness D2 are determined respectively in such a manner that the ratio $R_{A(1)}$ of the intensity of light in the first wavelength region incident on the first semiconductor layer from the side of the insulating film to the intensity of light in the first wavelength region incident on the insulating film after passing through the first semiconductor layer from above the substrate is higher than the ratio $R_{B(1)}$ of the intensity of light in the first wavelength region incident on the second semiconductor layer from the side of the insulating film to the intensity of light in the first wavelength region incident on the insulating film after passing through the second semiconductor layer from above the substrate, and the ratio $R_{B(2)}$ of the intensity of light in the second wavelength region incident on the second semiconductor layer from the side of the insulating film to the intensity of light in the second wavelength region incident on the insulating film after passing through the second semiconductor layer from above the substrate is higher than the ratio $R_{A(2)}$ of the intensity of light in the second wavelength region incident on the first semiconductor layer from the side of the insulating film to the intensity of light in the second wavelength region incident on the insulating film after passing through the first semiconductor layer from above the substrate.

In one preferred embodiment, a thin film transistor supported by the substrate is further provided, the thin film transistor includes a third semiconductor layer and a third light blocking layer disposed on the substrate side of the third semiconductor layer, the insulating film is formed between the third semiconductor layer and the third light blocking layer, and a thickness D3 of a portion of the insulating film positioned between the third semiconductor layer and the third light blocking layer is substantially equal to the thickness D1.

In one preferred embodiment, a thin film transistor supported by the substrate is further provided, the thin film transistor includes a third semiconductor layer and a third light blocking layer disposed on the substrate side of the third semiconductor layer, the insulating film is formed between the third semiconductor layer and the third light blocking layer, and a thickness D3 of a portion of the insulating film positioned between the third semiconductor layer and the third light blocking layer is substantially equal to the thickness D2.

The production method of a semiconductor device of the present invention is a production method of a semiconductor device including a substrate and a first and a second thin film diodes supported by the substrate, including: (a) a step of forming a first and a second light blocking layers on the substrate; (b) a step of forming an insulating film to cover the first and the second light blocking layers, a portion of the insulating film located on the second light blocking layer being thicker than a portion of the insulating film located on the first light blocking layer; (c) a step of forming a first island-like semiconductor layer as an active region of the first thin film diode and a second island-like semiconductor layer as an active region of the second thin film diode, the first island-like semiconductor layer being disposed in a region light-blocked by the first light blocking layer and the second island-like semiconductor layer being disposed in a region light-blocked by the second light blocking layer.

Advantageous Effects of Invention

According to the present invention, in a semiconductor device provided with a first and a second thin film diodes in which wavelength regions of light to be detected are mutually different on one and the same substrate, light in the wavelength region to be detected by respective one of the thin film diodes can be efficiently incident on the semiconductor layer of the corresponding thin film diode. As a result, both of the effective sensitivities of a sensor utilizing the first thin film diode and a sensor utilizing the second thin film diode can be obtained sufficiently.

Particularly, the present invention is preferably applied to a semiconductor device provided with a diode for detecting visible light and a diode for detecting infrared rays, thereby greatly increasing the sensing sensitivity to infrared rays as compared with the prior art, while the sensing sensitivity to visible light is ensured.

According to the invention, the above-described semiconductor device can be easily produced without increasing the number of production process steps and the production cost, so that product downsizing, superior performance, and cost lowering can be realized.

The present invention is suitably applied to a display device having a touch panel function, a display device having a scanner function, and a display device having both of the functions.

BRIEF DESCRIPTION OF DRAWINGS

In FIG. 5, (a) to (d) are schematic sectional process diagrams for illustrating another production method of the first and the second thin film diodes in the semiconductor device in the first embodiment of the present invention, respectively.

FIG. 6 is a schematic sectional diagram showing two thin film diodes and a thin film transistor in a semiconductor device in a second embodiment of the present invention.

In FIG. 10, (a) and (b) are a circuit diagram and a plan view, respectively, exemplarily showing the configuration of an optical sensor portion in the third embodiment of the present invention.

DESCRIPTION OF EMBODIMENTS

First, with reference to the accompanying drawings, the configuration of two thin film diodes formed on one and the same substrate and the sensitivity of sensors utilizing the respective thin film diodes will be described.

Figure 11:
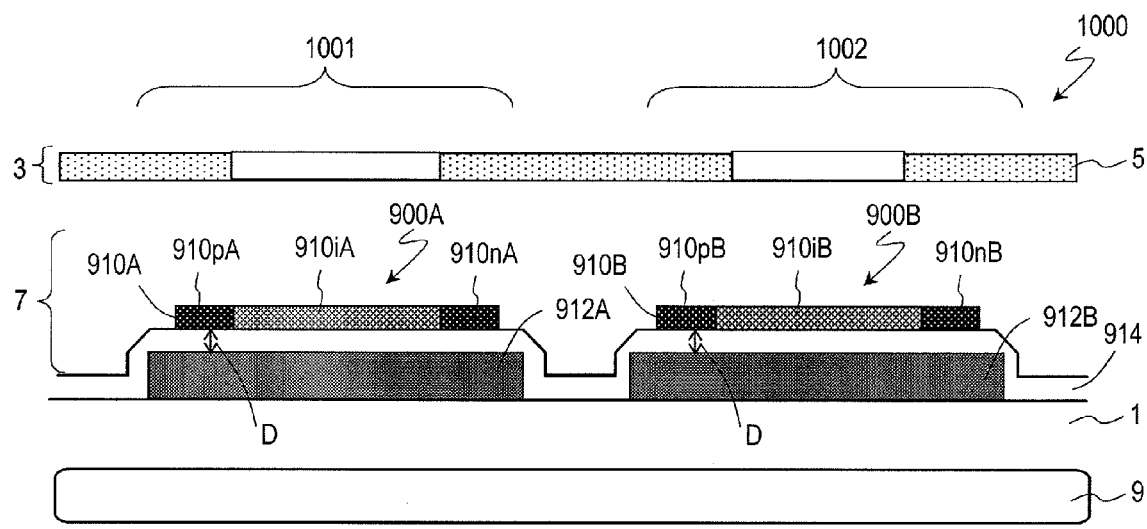
FIG. 11 is a sectional diagram for illustrating the configuration of a thin film diode in a reference example.

FIG. 11 is a sectional diagram showing a semiconductor device 1000 in a reference example. Herein, two thin film diodes 900A and 900B formed on a rear substrate of a liquid crystal display device are exemplarily described. In this example, the diode 900A is used for a visible light sensor 1001 for detecting visible light, and the diode 900B is used for an infrared-ray sensor 1002 for detecting infrared rays.

The semiconductor device 1000 includes a substrate 1, diodes 900A and 900B formed on the substrate 1, a counter substrate 3, disposed opposite to the substrate 1, having color filters (not shown) and a CF light blocking portion 5, a liquid crystal layer 7 provided between the substrate 1 and the counter substrate 3, and a backlight 9 provided on the rear side of the substrate 1 (on the opposite side to the liquid crystal layer 7). The backlight 9 is an IR backlight for emitting light including infrared rays.

The diode 900A includes a light blocking layer 912A formed on the substrate 1, an insulating film 914 covering the light blocking layer 912A, and an island-like semiconductor layer 910A formed on the insulating film 914. The light blocking layer 912A is disposed so that the light from the backlight 9 will not be incident on the semiconductor layer 910A from the rear side of the semiconductor layer 910A. The semiconductor layer 910A includes a P-type region 910pA, an N-type region 910nA, and an intrinsic region 910iA, positioned between the P-type region 910pA and the N-type region 910nA, functioning as a light receiving region. Although not shown in the figure, the P-type region 910pA is connected to an anode electrode, and the N-type region 910nA is connected to a cathode electrode. The diode 900B has the same configuration as that of the diode 900A.

The diodes 900A and 900B are fabricated on the substrate 1 by the common process. Therefore, the light blocking layers 912A and 912B are formed by patterning one and the same light blocking film. Similarly, the semiconductor layers 910A and 910B are formed by patterning one and the same semiconductor film. In addition, the insulating film 914 positioned between the semiconductor layer 910A and the light blocking layer 912A and between the semiconductor layer 910B and the light blocking layer 912B is common. Accordingly, the thickness of a portion of the insulating film positioned between the semiconductor layer 910A and the light blocking layer 912A and the thickness of a portion of the insulating film positioned between the semiconductor layer 910B and the light blocking layer 912B are usually equal (the thickness D).

In the semiconductor device 1000, when the sensitivity of one of the sensors is high, the sensitivity of the other sensor may disadvantageously be low. Thus, it is difficult to sufficiently obtain both of the sensitivity of the visible light sensor 1001 and the sensitivity of the infrared-ray sensor 1002.

Hereinafter the reasons will be described.

The diodes 900A and 900B perform the sensing of light (incident light) incident on the intrinsic regions 910iA and 910iB of the semiconductor layers 910A and 910B after passing through the counter substrate 3. At this time, when the diode 900A is described exemplarily, part of the incident light is not absorbed by the intrinsic region 910iA and is transmitted therethrough. The transmitted light is reflected from the surface of the light blocking layer 912A disposed on the rear side of the intrinsic region 910iA. Part of the reflected light is incident on the intrinsic region 910iA again, and is absorbed therein. The remaining of the reflected light is further reflected from an interface between the insulating film 914 and the semiconductor layer 910A, and then, reflected again from the light blocking layer 912A. As described above, part of light transmitted through the semiconductor layer 910A of the incident light is repetitively reflected between the semiconductor layer 910A and the light blocking layer 912A (multiple reflection). Similarly, in the diode 900B, multiple reflection of the incident light occurs between the semiconductor layer 910B and the light blocking layer 912B.

Figure 12:
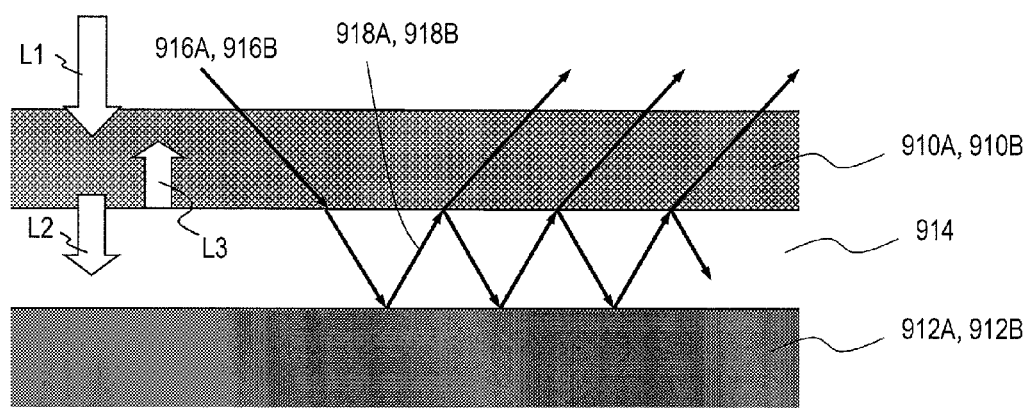
FIG. 12 is a schematic diagram for illustrating multiple reflection occurring between a semiconductor layer and a light blocking layer in a thin film diode.

FIG. 12 is an enlarged sectional diagram schematically showing the multiple reflection of light occurring between the semiconductor layers 910A and 910B and the light blocking layers 912A and 912B. The rays of light repetitively reflected between the semiconductor layers 910A and 910B and the light blocking layers 912A and 912B (light rays of multiple reflection) are mutually interfered. Accordingly, the reflectance R with respect to the light of specific wavelength is increased, so that the amount of light of the corresponding wavelength incident on the semiconductor layers 910A and 910B of the diodes is increased. For easy understanding, FIG. 12 shows the light 916A and 916B incident in the inclined direction with respect to the normal line of the surface of the substrate 1. However, the multiple reflection also occurs for the light incident along the normal line of the surface of the substrate 1.

Herein when the light of wavelength λ incident on the semiconductor layers 910A and 910B from the side of the counter substrate 3 is denoted by L1, part of the incident light L1 is absorbed by the semiconductor layers 910A and 910B. Light L2 which is not absorbed of the incident light L1 is transmitted through the semiconductor layers 910A and 910B and then incident on the insulating film 914. The light L2 is multiple-reflected between the semiconductor layers 910A and 910B and the light blocking layers 912A and 912B. As a result, part of the light L2 (reflected light L3) is incident on the semiconductor layers 910A and 910B from the side of the insulating film 914. If the amplitudes of rays of wavelength λ are increased due to the interference of the multiple-reflected rays, the ratio of the intensity Ir of the reflected light L3 incident on the semiconductor layers 910A and 910B from the side of the insulating film 914 to the intensity Io of the light L2 incident on the insulating film 914 of the incident light L1 (hereinafter referred to as "reflectance R") is increased. On the other hand, if the amplitudes of rays of wavelength λ are reduced due to the interference of multiple-reflected rays, the reflectance R is lowered.

The wavelength λ of rays for which the reflectance R is increased is determined depending on the thickness D and the refractive index n of the insulating film 914, and represented by the following expression:

$$D = (\lambda/2n) \cdot (k + \frac{1}{2}) \text{ (}k\text{ is an integer)} \quad (1)$$

This expression (1) represents the case where the light is incident from the normal direction of the surface of the substrate 1. Accordingly, the thickness D of the insulating film 914 is optimized based on the above expression (1), so as to increase the reflectance R with respect to the light of a specific wavelength λ. As a result, the amount of light of the wavelength λ incident on the semiconductor layers 910A and 910B of the diodes can be increased.

In the diodes 900A and 900B shown in FIG. 11, the thicknesses D of the insulating film 914 are the same. For this reason, if the thickness D of the insulating film 914 is selected so as to increase the reflectance R of the light in a wavelength region to be detected by one of the diodes, the sensitivity of the sensor including the diode can be improved. However, the reflectance R of the light having the wavelength detected by the other diode is lowered, so that the sensitivity of the sensor including the diode is degraded. As described above, according to the configuration of the reference example, it is difficult to optimize the respective characteristics of the diodes 900A and 900B in accordance with the application, and there is a problem that both of the sensitivity of the visible light sensor 1001 and the sensitivity of the infrared-ray sensor 1002 cannot be sufficiently attained.

The inventors of the present invention found that in a semiconductor device provided with two diodes in which wavelength regions of light to be detected are different on one and the same substrate, the thicknesses D of the insulating film positioned below the semiconductor layers of the diodes are optimized respectively in accordance with the wavelength regions of light to be detected by the respective diodes, thereby solving the above-mentioned problems. Accordingly, by utilizing the multiple reflection of light as shown in FIG. 12, the light in the wavelength region to be detected by the diode can be efficiently incident on the semiconductor layer of each diode. Therefore, both of the sensitivities of the sensors of the respective diodes can be attained sufficiently.

In the conventional diodes 900A and 900B, the thickness D of the insulating film cannot be optimized in one or both of the diodes. This may cause a problem that the sensitivity is largely varied depending on the variation of the thickness D. On the other hand, according to the present invention, the thicknesses D of the insulating film of both of the diodes are optimized, respectively, so that it is possible to reduce the variation in sensitivity depending on the variation in the thickness D. For example, in the sensitivity curve shown in FIG. 3, in the vicinity of the maximum of the sensitivity, the variation in sensitivity depending on the variation in the thickness of the insulating film is small. Therefore, a margin for the thickness D can be ensured.

First Embodiment

Hereinafter, a first embodiment of a semiconductor device of the present invention will be described. The semiconductor device in the present embodiment is a liquid crystal display device having an optical sensor portion utilizing a thin film diode, for example.

Figure 1:
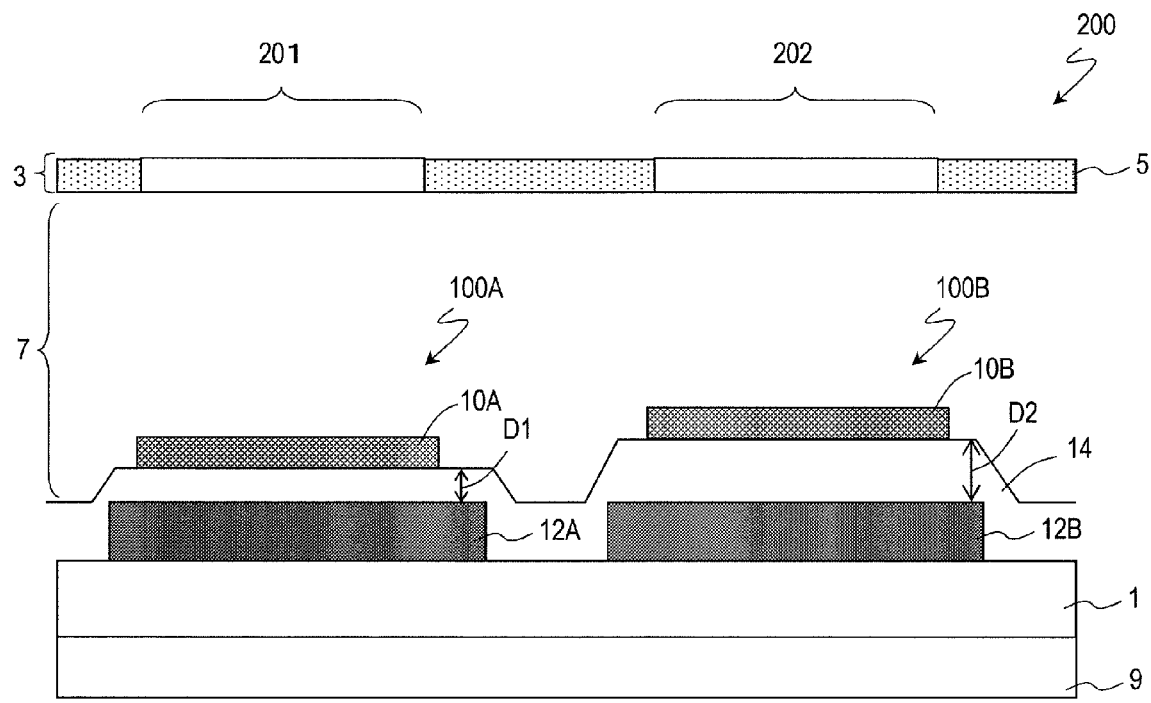
FIG. 1 is a schematic sectional diagram showing the configuration of two thin film diodes in a first embodiment of the present invention.

FIG. 1 is a schematic sectional diagram showing two thin film diodes 100A and 100B in the semiconductor device in the present embodiment. For simplicity, the components similar to those in FIG. 11 are designated by the same reference numerals, and the descriptions thereof are omitted.

A semiconductor device 200 in the present embodiment is provided with an optical sensor portion including a first sensor 201 for detecting light in a first wavelength region and a second sensor 202 for detecting light in a second wavelength region. The first sensor 201 has a first thin film diode 100A, and the second sensor 202 has a second thin film diode 100B, respectively. The second wavelength region includes a wavelength longer than the maximum wavelength of the first wavelength region. In other words, the maximum wavelength of the second wavelength region is longer than the maximum wavelength of the first wavelength region. The first wavelength region and the second wavelength region may partially overlap.

The first thin film diode 100A includes a semiconductor layer 10A, and a light blocking layer 12A disposed on the side of the substrate 1 of the semiconductor layer 10A. Similarly, the second thin film diode 100B includes a semiconductor layer 10B, and a light blocking layer 12B disposed on the side of the substrate 1 of the semiconductor layer 10B. The semiconductor layers 10A and 10B are disposed in regions in which light from the side of the substrate 1 is blocked by the light blocking layers 12A and 12B, respectively. In this embodiment, the light blocking layers 12A and 12B not only block the light from the rear side of the substrate 1, but also function as reflecting layers for reflecting light incident from above the substrate 1.

An insulating film 14 is formed between the semiconductor layer 10A and the light blocking layer 12A and between the semiconductor layer 10B and the light blocking layer 12B. A thickness D1 of a portion of the insulating film positioned between the semiconductor layer 10A and the light blocking layer 12A is different from a thickness D2 of a portion of the insulating film 14 positioned between the semiconductor layer 10B and the light blocking layer 12B.

The thickness D1 of the insulating film 14 is set in such a manner that the reflectance R of light in the first wavelength region (the ratio of the intensity of light L3 incident on the semiconductor layer 10A from the side of the insulating film 14 to the intensity of light L2 incident on the insulating film 14 after being transmitted through the semiconductor layer 10A from above the substrate) is high. That is, the thickness D1 of the portion of the insulating film 14 positioned between the semiconductor layer 10A and the light blocking layer 12A is determined so that the amplitudes of light rays in the first wavelength region are mutually increased by multiple reflection and the intensity of light incident again on the semiconductor layer 10A is increased. Specifically, the thickness D1 can be obtained by the above expression (1) in accordance with the refractive index n of the insulating film 14 and the wavelength $\lambda$ of the first wavelength region. Similarly, the thickness D2 is set so that the reflectance R of light in the second wavelength region is high. That is, the thickness D2 is determined so that the amplitudes of light rays in the second wavelength region are mutually increased by multiple reflection and the intensity of light incident again on the semiconductor layer 10B is increased.

When the thicknesses D1 and D2 are obtained, if the same value is selected as the integer k in the expression (1), the thickness D2 is larger than the thickness D1. Since the integer k can be arbitrarily selected, the thickness D1 is sometimes larger than the thickness D2. However, if the thickness of the insulating film 14 is increased, it takes a longer time to form the film, and it is sometimes difficult for the multiple reflection to occur. For this reason, the integer k is preferably equal to zero.

Figure 2:
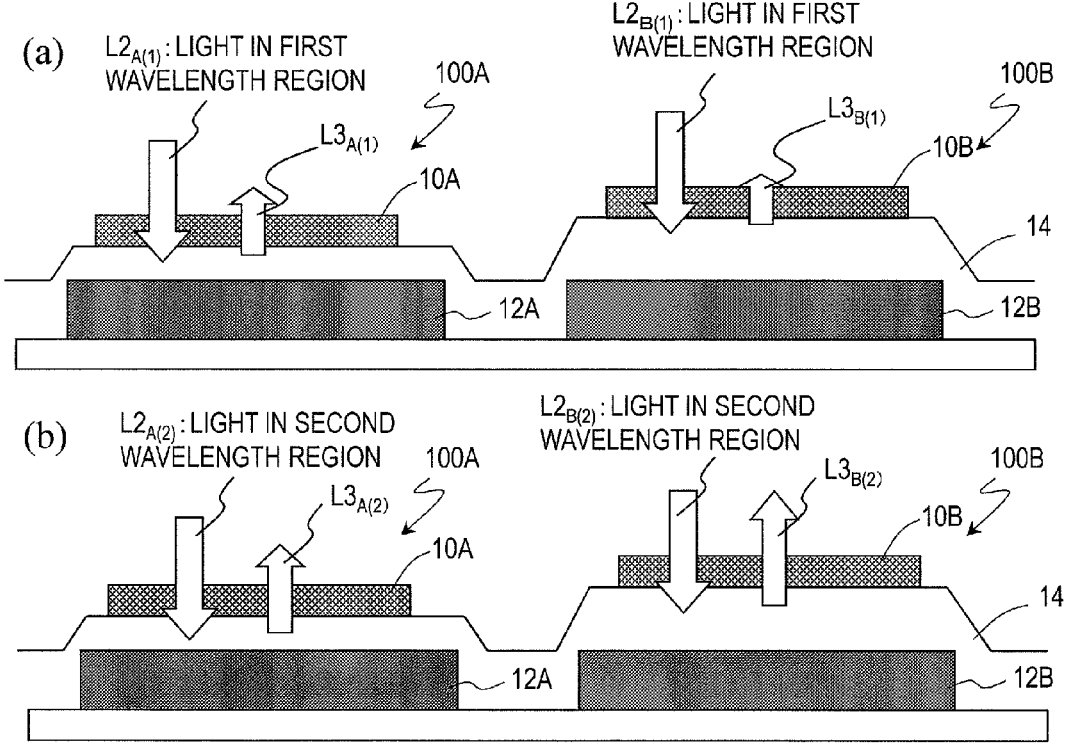
In FIG. 2, (a) is a schematic diagram exemplarily showing light in a first wavelength region (incident light) L2 incident on an insulating film after passing through a semiconductor layer of a thin film diode and light (reflected light) L3 of the light L2 incident on the semiconductor layer from the side of the insulating film, and (b) is a schematic diagram exemplarily showing light in a second wavelength region incident on the insulating film after passing through the semiconductor layer of the thin film diode and light L3 of the light L2 incident on the semiconductor layer from the side of the insulating film.

When the thicknesses D1 and D2 are optimized in the above-described way, as shown in FIG. 2(*a*), the ratio (reflectance) $R_{A(1)}$ of the intensity of light (reflected light) $L3_{A(1)}$ in the first wavelength region incident on the semiconductor layer 10A from the side of the insulating film 14 to the intensity of light (incident light) $L2_{A(1)}$ in the first wavelength region incident on the insulating film 14 after passing through the semiconductor layer 10A from above the substrate 1 is higher than the ratio $R_{B(1)}$ of the intensity of light $L3_{B(1)}$ in the first wavelength region incident on the semiconductor layer 10B from the side of the insulating film 14 to the intensity of light $L2_{B(1)}$ in the first wavelength region incident on the insulating film 14 after passing through the semiconductor layer 10B from above the substrate 1.

As shown in FIG. 2(*b*), the ratio $R_{B(2)}$ of the intensity of light $L3_{B(2)}$ in the second wavelength region incident on the semiconductor layer 10B from the side of the insulating film 14 to the intensity of light $L2_{B(2)}$ in the second wavelength region incident on the insulating film 14 after passing through the semiconductor layer 10B from above the substrate 1 is higher than the ratio $R_{A(2)}$ of the intensity of light $L3_{A(2)}$ in the second wavelength region incident on the semiconductor layer 10A from the side of the insulating film 14 to the intensity of light $L2_{A(2)}$ in the second wavelength region incident on the insulating film 14 after passing through the semiconductor layer 10A from above the substrate 1.

Accordingly, the intensity of light in the first wavelength region incident on the semiconductor layer 10A in the first thin film diode 100A is higher than the intensity of light in the first wavelength region incident on the semiconductor layer 10B in the second thin film diode 100B. In addition, the intensity of light in the second wavelength region incident on the semiconductor layer 10B in the second thin film diode 100B is higher than the intensity of light in the second wavelength region incident on the semiconductor layer 10A in the first thin film diode 100A. The "light incident on the semiconductor layers 10A and 10B" used herein includes, in addition to the light L1 incident on the semiconductor layers 10A and 10B from above the semiconductor layers 10A and 10B (from the side of the counter substrate 3), the light L3 incident on the semiconductor layers 10A and 10B from the side of the insulating film 14 by the multiple reflection shown in FIG. 12.

As described above, according to the present embodiment, by optimizing the thickness of the insulating film 14, part of the light L2 in a specific wavelength region emitted from above the substrate which is not absorbed by but is transmitted through the semiconductor layers 10A and 10B in the thin film diodes 100A and 100B can be incident again on the semiconductor layers 10A and 10B by the multiple reflection. Accordingly, the amount of incident light in desired wavelength regions can be respectively increased for the semiconductor layers 10A and 10B in the thin film diodes 100A and 100B. As a result, the output performances of sensors using the respective thin film diodes 100A and 100B can be improved.

According to the present embodiment, it is not necessary to increase the thicknesses of the semiconductor layers 10A and 10B in order to improve the light sensitivities of the thin film diodes 100A and 100B, so that it is possible to easily form the semiconductor layers 10A and 10B by laser crystallization for the amorphous silicon film. In addition, the light sensitivities can be improved without increasing the area of light receiving regions of the thin film diodes 100A and 100B, so that it is possible to ensure high aperture ratio especially in the case where the diodes 100A and 100B are formed in a display area.

The first wavelength region preferably includes visible light. The second wavelength region preferably includes infrared rays. Accordingly, good sensing performance can be exhibited over the wavelength region from infrared rays to visible light. In such a case, as the backlight 9, an IR backlight which emits light including infrared rays is preferably used. Accordingly, by utilizing the light from the backlight 9, the second sensor 202 utilizing the second thin film transistor 100B can perform the sensing of a finger, an image, or the like which comes into contact with the panel surface.

Herein when the optimal value of the thickness D1 is obtained from the above expression (1), where the wavelength $\lambda$ of visible light is 550 nm, the refractive index n of the insulating film (for example, an $SiO_2$ film) 14 is 1.5, and the integer k is 0, the thickness D1 is about 92 nm. Alternatively, when the thickness D2 is obtained where the wavelength $\lambda$ of infrared rays is 780 nm, the refractive index n of the insulating film 14 is 1.5, and the integer k is 0, the optimal value of the thickness D2 is about 130 nm.

Figure 3:
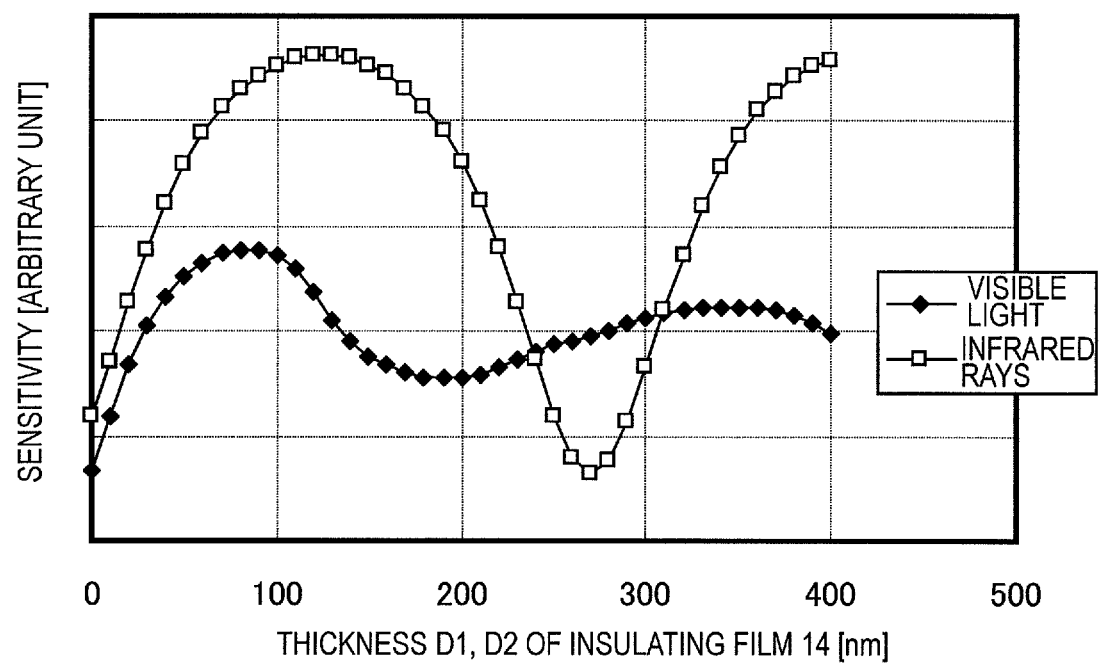
FIG. 3 is a graph showing the relationship between the thickness of an insulating film 14 and the sensitivity of a thin film diode.

FIG. 3 is a graph illustrating the relationship between the thicknesses D1 and D2 of the insulating film 14, and the sensitivity to the visible light and the infrared rays. Herein the reflectance of a multi-layered thin film including a substrate, a light blocking layer, an insulating film (two-layer structure of an SiN film and an $SiO_2$ film), and a semiconductor layer (a poly-silicon film) in this order is calculated by utilizing Fresnel reflection coefficient, and the obtained reflectance of the multi-layered thin film is regarded as the "sensitivity." As is seen from FIG. 3, the sensitivities to visible light and infrared rays depend on the thicknesses D1 and D2 of the insulating film 14, respectively.

It is seen from FIG. 3 that the thickness D1 for which the sensitivity to visible light is the highest is about 92 nm (k=0). It is seen that the thickness D2 for which the sensitivity to infrared rays is the highest is about 130 nm (k=0) and about 390 nm (k=1). The relationship between the thickness of the insulating film 14 and the sensitivity in FIG. 3 is only exemplarily shown. The relationship can properly varied in accordance with the materials (refractive indices) and the like of the insulating film 14, the light blocking layers 12A and 12B, and the semiconductor layers 10A and 10B.

From the result shown in FIG. 3, it is found that when the thicknesses D1 and D2 are optimized respectively, the sensitivity to infrared rays is about twice as high as the sensitivity to visible light. It is considered that the reason why is that the infrared rays are not absorbed by the semiconductor layer and easily transmitted therethrough, and the amount of light rays which are incident again on the semiconductor layer by multiple reflection and then absorbed is large, so that photo leakage current generated in the semiconductor layer is greatly increased as compared with the case where the light blocking layer is not provided.

In the present embodiment, the thin film diodes 100A and 100B are preferably formed on one and the same substrate by a common process. Accordingly, the light blocking layers 12A and 12B are preferably formed by patterning one and the same light blocking film. In addition, the semiconductor layers 10A and 10B are preferably formed by using one and the same semiconductor film, but alternatively formed by using different semiconductor films. Although not shown in the figure, the semiconductor device 200 in this embodiment may further include a thin film transistor.

In the display area of the semiconductor device (the display device) 200, the first sensor 201 including the first thin film diode 100A and the second sensor 202 including the second thin film diode 100B may be formed for each pixel, or for each pixel set having a plurality of pixels. These sensors 201 and 202 may constitute separate sensors independently functioning, respectively. For example, the first sensor 201 may function as a sensor for detecting visible light, and the second sensor 202 may function as a sensor for detecting infrared rays. At this time, the sensor for detecting infrared rays may include a color filter for cutting out visible light.

Alternatively, the sensors 201 and 202 may be connected in parallel, thereby constituting one optical sensor portion. With such a configuration, based on the output from one of the sensors 201 and 202 which detects light to be sensed, or which detects the light with higher sensitivity (i.e. larger photo leakage current), the sensing can be performed. Accordingly, all of light rays which can be detected by at least one of the sensors 201 and 202 can be detected, so that the detectable wavelength region can be significantly expanded. The sensing is performed by using one of the sensors 201 and 202 with higher sensitivity to the light to be sensed, so that the sensitivity can be enhanced as compared with the prior art.

It is preferred that the first wavelength region and the second wavelength region may partially overlap. If there is no overlap portion, the range to be detected by the optical sensor portion may disadvantageously be discontinuous. It is sufficient that the second wavelength region may include a wavelength larger than the maximum wavelength of the first wavelength region, and the shortest wavelength in the second wavelength region may be shorter than the shortest wavelength in the first wavelength region.

Figure 4:
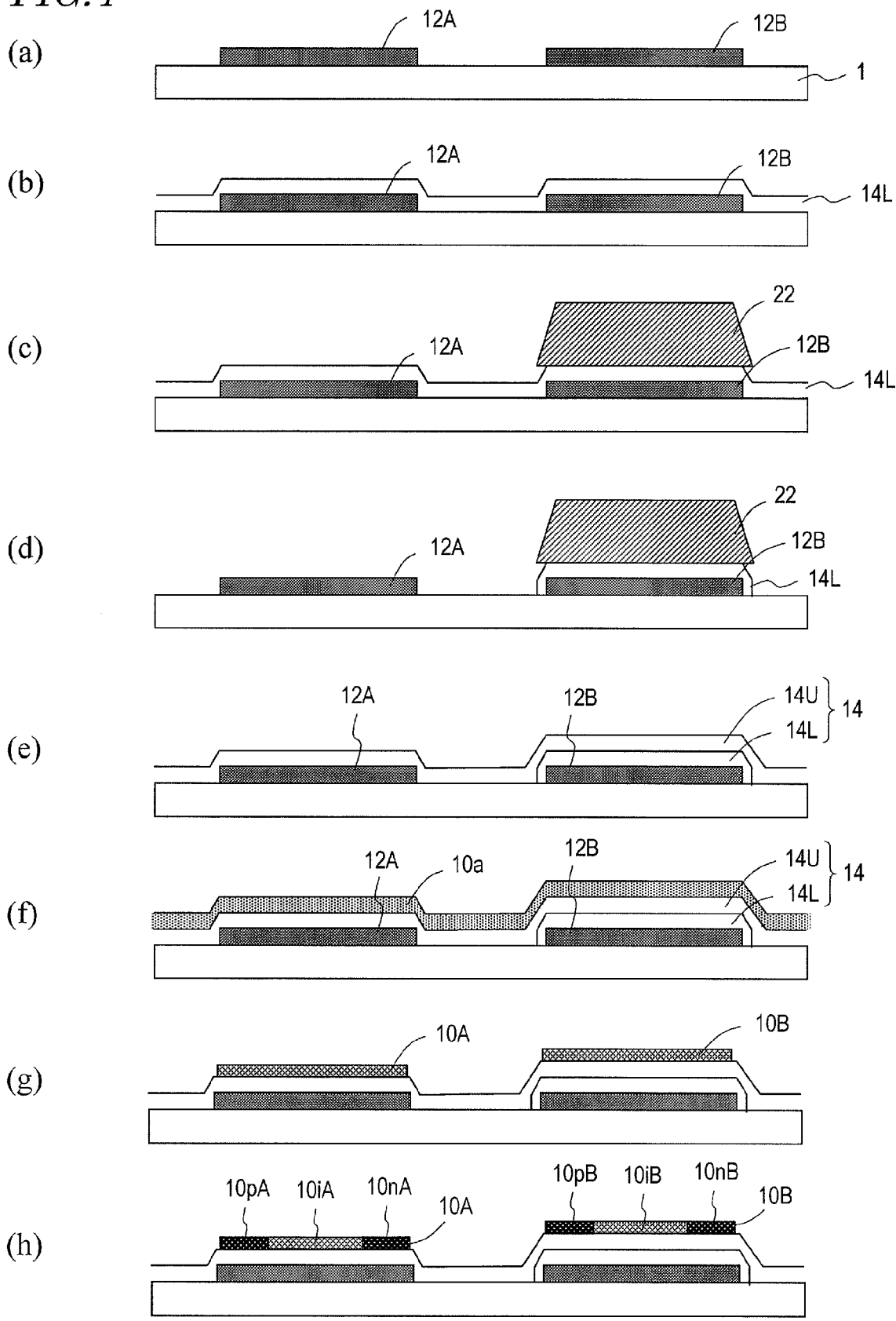
In FIG. 4, (a) to (h) are schematic sectional process diagrams for illustrating the production method of a first and a second thin film diodes in the semiconductor device in the first embodiment of the present invention, respectively.

The thin film diodes 100A and 100B in this embodiment are produced in the following method, for example. In FIG. 4, (a) to (h) are schematic sectional process diagrams for exemplarily illustrating the production method of the thin film diodes 100A and 100B.

First, as shown in FIG. 4(a), on a substrate 1, light blocking layers 12A and 12B are formed. As the substrate 1, a low alkali glass substrate or a quartz substrate can be used. In this embodiment, the low alkali glass substrate is employed. In this case, heat treatment at temperatures lower than a glass strain point by about 10 to 20° C. may be previously performed.

The light blocking layers 12A and 12B are located so as to block the light from the back side of the substrate 1 to the first and the second thin film diodes. The light blocking layers 12A and 12B can be formed by patterning a metal film or the like. In the case of the metal film, in view of heat treatment in a succeeding production process, a film of a metal with high melting point such as tantalum (Ta), tungsten (W), molybdenum (Mo), or the like may preferably be used. In this embodiment, an Mo film is formed by sputtering, and patterned, thereby forming the light blocking layers 12A and 12B. The thicknesses of the light blocking layers 12A and 12B are 100 to 200 nm, and preferably 150 to 200 nm. In this embodiment, the thicknesses are 100 nm, for example.

Next, as shown in FIG. 4(b), a first insulating film 14L is formed so as to cover the substrate 1 and the light blocking layers 12A and 12B. Herein an $SiO_2$ film (the refractive index n: 1.46), an SiNO film (the refractive index n: 1.67), or the like is formed as the first insulating film 14L by plasma CVD, for example.

Next, as shown in FIG. 4(c), on the first insulating film 14L, a photo mask 22 is formed so as to cover one of the light blocking layers (the light blocking layer 12B herein) and so as not to cover the other light blocking layer (the light blocking layer 12A herein).

Next, as shown in FIG. 4(d), a portion of the first insulating film 14L which is not covered with the photo mask 22 is removed by etching. Thereafter, the photo mask 22 is removed.

Thereafter, as shown in FIG. 4(e), a second insulating film 14U is formed so as to cover both of the light blocking layers 12A and 12B. Herein an $SiO_2$ film (the refractive index n: 1.46), an SiNO film (the refractive index n: 1.67), or the like is formed as the second insulating film 14U by plasma CVD, for example. The material of the second insulating film 14U may be the same as that of the first insulating film 14L, but alternatively be different. In this way, the insulating film 14 constituted by the first and second insulating films 14L and 14U is obtained.

In this embodiment, a portion of the insulating film 14 positioned on the light blocking layer 12A is constituted only by the second insulating film 14U. The thickness D1 of the second insulating film 14U is 92 nm, for example. On the other hand, a portion of the insulating film 14 positioned on the light blocking layer 12B is constituted by the first and the second insulating films 14L and 14U. Herein the first insulating film 14L is formed by the same material as that of the second insulating film 14U. The total thickness D2 of the first and the second insulating films 14L and 14U is 130 nm, for example. The thicknesses D1 and D2 are not limited to the above-described values, but may have values optimized based on the expression (1). In view of the parasitic capacitance and insulation properties of the semiconductor layers 10A an 10B and the light blocking layers 12A and 12B, the thicknesses D1 and D2 are preferably 90 nm or more, for example, and more preferably 100 nm or more. If the insulating film 14 is too thick, it takes a lot of time to form the insulating film 14, so that the thicknesses D1 and D2 are preferably 400 nm or less.

Next, as shown in FIG. 4(f), on the insulating film 14, a non-crystalline semiconductor film (herein an amorphous silicon film) 10a is formed. The a-Si film 10a is formed by a known method such as plasma CVD or sputtering. The thickness of the non-crystalline semiconductor film 10a is not less than 20 nm and not greater than 70 nm, and preferably not less than 40 nm and not greater than 60 nm. In this embodiment, an a-Si film having the thickness of 50 nm is formed by plasma CVD.

Thereafter, as shown in FIG. 4(g), a crystalline semiconductor film (herein a poly-silicon film) is formed by crystallizing the non-crystalline semiconductor layer 10a, and then patterned, thereby obtaining semiconductor layers 10A and 10B. The crystallization of the non-crystalline semiconductor film 10a can be performed by laser crystallization. Alternatively, the crystallization may be performed in such a way that after a catalyst element is added to the non-crystalline semiconductor film 10a, annealing treatment is performed.

Next, as shown in FIG. 4(h), P-type regions 10pA and 10pB, and N-type regions 10nA and 10nB are formed in the semiconductor layers 10A and 10B. Specifically, a photo mask (not shown) is formed so as to expose only regions to be P-type regions in the semiconductor layers 10A and 10B, in this condition, P-type impurity (e.g., boron) is injected. As a result, the P-type regions 10pA and 10pB are obtained. Then a photo mask (not shown) is formed so as to expose only regions to be N-type regions in the semiconductor layers 10A and 10B, and in this condition, N-type impurity (e.g., phosphorous) is injected. As a result, the N-type regions 10nA and 10nB are obtained. The remaining regions of the semiconductor layers 10A and 10B in which the P-type regions and the N-type regions are not formed constitute intrinsic regions 10iA and 10iB. In this specification, "the intrinsic region" indicates a region, sandwiched between the P-type region and the N-type region, having lower impurity concentration (i.e., higher resistance) than the P-type and N-type regions. Accordingly, the intrinsic region may be a region of intrinsic semiconductor or a region in which P-type or N-type impurity is injected with lower concentration than in the P-type regions or the N-type regions. Although not shown in the figure, after the above-described P-type and N-type impurity injecting processes, heat treatment is performed under an inert atmosphere, for example, under an atmosphere of nitrogen, so that the P-type regions 10pA and 10pB and the N-type regions 10nA and 10nB are activated.

Alternatively, before the P-type and N-type impurity injecting processes, an insulating film for covering the semiconductor layers 10A and 10B may be formed. In such a case, the injection of impurity can be performed from above the insulating film (through doping).

The production method of the thin film diode in this embodiment is not limited to the method shown in FIG. 4. In FIG. 5, (a) to (d) are schematic sectional process diagrams for illustrating another example of the production method of the thin film diodes 100A and 100B.

First, as shown in FIG. 5(a), on a substrate 1, light blocking layers 12A and 12B are formed, and then, a first insulating film 14L is formed so as to cover the light blocking layers 12A and 12B. The light blocking layers 12A and 12B and the first insulating film 14L can be formed by the same methods as those described above with reference to FIG. 4(a) and FIG. 4(b). Herein as the first insulating film 14L, a silicon nitride film (an SIN film) is formed by plasma CVD. The refractive index n of the SIN film is about 2.0.

Then, as shown in FIG. 5(b), on the first insulating film 14L, a second insulating film 14U is formed. Herein as the second insulating film 14U, a TEOS (Tetraethyl-Ortho-Silicate) film is formed by plasma CVD. The refractive index n of the TEOS film is about 1.39.

The material of the second insulating film 14U may be the same as that of the first insulating film 14L, but may be preferably different from each other. It is preferred that the materials of the respective insulating films 14L and 14U and an etchant may be selected so that only the second insulating film 14U is selectively etched in an etching process performed subsequently, i.e., so that the etch selectivity to the etchant is high.

Next, as shown in FIG. 5(c), on the second insulating film 14U, a photo mask 24 is formed so as to cover one of the light blocking layers (the light blocking layer 12A herein) and so as not to cover the other light blocking layer (the light blocking layer 12B herein).

Next, as shown in FIG. 5(d), a portion of the second insulating film 14U which is not covered with the photo mask is selectively removed by etching. Herein buffered hydrogen fluoride (BHF) is used as the etchant. After the etching, the photo mask 24 is removed. In this way, an insulating film 14 constituted by the first and the second insulating films 14L and 14U is obtained.

In this embodiment, a portion of the insulating film 14 positioned on the light blocking layer 12A is constituted only by the first insulating film (the SIN film) 14L. The thickness D1 thereof is 92 nm, for example. On the other hand, a portion of the insulating film 14 positioned on the light blocking layer 12B is constituted by the first and the second insulating films 14L and 14U, and the total thickness D2 is 130 nm, for example. Similarly to the method described above with reference to FIG. 4, the thicknesses D1 and D2 are not limited to the above-mentioned thicknesses, but are optimized respectively based on the expression (1) in the range of not less than 90 nm and not greater than 400 nm.

Thereafter, although not shown in the figure, after semiconductor layers 10A and 10B are formed on the insulating film 14 by the same method as that described above with reference to (f) to (h) in FIG. 4, P-type regions 10pA and 10pB, N-type regions 10nA and 10nB, and intrinsic regions 10iA and 10iB are formed in the semiconductor layers 10A and 10B, respectively.

In the process described above with reference to FIG. 4 and FIG. 5, crystalline semiconductor layers are formed as the semiconductor layers 10A and 10B. Alternatively, the semiconductor layers 10A and 10B may be non-crystalline layers, or may be microcrystalline silicon layers.

In addition, in the above-described process, the insulating film 14 is formed from the two-layered insulating film. Alternatively, the insulating film 14 may be a single layer, or may have a layered structure including three or more layers. In the case where the insulating film 14 having a multi-layered structure is to be formed, instead of the expression (1), thicknesses of respective layers constituting the insulating film 14 can be optimized by using known conditions for interference by multi-layer films.

Second Embodiment

Hereinafter with reference to the drawings, a second embodiment of the semiconductor device of the present invention will be described. The semiconductor device in the second embodiment is different from the first embodiment in that in addition to the two types of thin film diodes, a thin film transistor is formed on one and the same substrate. The present embodiment can be applied to an active matrix display device having an optical sensor portion such as a touch sensor, a scanner, or the like. The two types of thin film diodes may be connected in parallel, so as to constitute an optical sensor portion. The thin film transistor may be a pixel switching TFT disposed for each pixel in a display area of a display device, or may be a TFT for a circuit which constitutes a driving circuit in an area other than the display area (in a frame area). Alternatively, the thin film transistor may be a signal taking-out TFT used in the optical sensor portion.

FIG. 6 is a schematic sectional diagram showing thin film diodes 300A and 300B, and a thin film transistor 300C in a semiconductor device 400 in this embodiment.

The semiconductor device 400 includes a substrate 1, the thin film diodes 300A and 300B formed on the substrate 1, and the thin film transistor 300C formed on the substrate 1. In this embodiment, the thin film diode 300A is used for a visible light sensor 401 for detecting visible light, and the thin film diode 300B is used for an infrared-ray sensor 402 for detecting infrared rays. The thin film diodes 300A and 300B have the same structures as those of the thin film diodes 100A and 100B shown in FIG. 1, respectively. For the simplicity, the same components as those in FIG. 1 are designated by the same reference numerals, and the descriptions thereof are omitted.

The thin film transistor 300C has a light blocking layer 12C, a semiconductor layer 10C, and a gate electrode (not shown) disposed on the semiconductor layer 10C via a gate insulating film. Although not shown, the semiconductor layer 10C has a source region, a drain region, and a channel region located between these regions. The gate electrode is disposed on the channel region. An insulating film 14 is formed between the light blocking layer 12C and the semiconductor layer 10C. A thickness D3 of a portion of the insulating film 14 positioned between the light blocking layer 12C and the semiconductor layer 10C is equal to the thickness D1 of a portion thereof positioned between the light locking layer 12A and the semiconductor layer 10A.

The reflectance of the thin film diode 300A and the reflectance of the thin film diode 300B in the semiconductor device 400 are similar to those of the thin film diodes 100A and 100B shown in FIG. 2(a) and FIG. 2(b), respectively. The reflectance of the thin film transistor 300C is similar to the reflectance of the thin film diode 300A.

If the "light in the first wavelength region" shown in FIG. 2(a) includes visible light, the reflectance of light in the first wavelength region of the thin film diode 300A and the thin film transistor 300C is similar to the reflectance of light in the first wavelength region of the thin film diode 100A. The reflectance of light in the first wavelength region of the thin film diode 300B is similar to the reflectance of light in the first wavelength region of the thin film diode 100B. In other words, the ratio (reflectance) $R_{A(1)}$ of the intensity of light (reflected light) $L3_{A(1)}$ in the first wavelength region (herein visible light) incident on the semiconductor layers 10A and 10C from the side of the insulating film 14 to the intensity of light (incident light) $L2_{A(1)}$ in the first wavelength region incident on the insulating film 14 after passing through the semiconductor layers 10A and 10C from above the substrate 1 is higher than the ratio $R_{B(1)}$ of the intensity of light $L3_{B(1)}$ in the first wavelength region incident on the semiconductor layer 10B from the side of the insulating film 14 to the intensity of light $L2_{B(1)}$ in the first wavelength region incident on the insulating film 14 after passing through the semiconductor layer 10B from above the substrate 1.

On the other hand, if "the light in the second wavelength region" shown in FIG. 2(b) includes infrared rays, the reflectance of light in the second wavelength region of the thin film diode 300A and the thin film transistor 300C is similar to the reflectance of light in the second wavelength region of the thin film diode 100A. The reflectance of light in the second wavelength region of the thin film diode 300B is similar to the reflectance of light in the second wavelength region of the thin film diode 100B. In other words, the ratio $R_{B(2)}$ of the intensity of light $L3_{B(2)}$ in the second wavelength region incident on the semiconductor layer 10B from the side of the insulating film 14 to the intensity of light $L2_{B(2)}$ in the second wavelength region incident on the insulating film after passing through the semiconductor layer 10B from above the substrate 1 is higher than the ratio $R_{A(2)}$ of the intensity of light $L3_{A(2)}$ in the second wavelength region incident on the semiconductor layers 10A and 10C from the side of the insulating film 14 to the intensity of light $L2_{A(2)}$ in the second wavelength region incident on the insulating film 14 after passing through the semiconductor layers 10A and 10C from above the substrate 1.

Accordingly, the intensity of visible light incident on the semiconductor layers 10A and 10C of the thin film diode 300A and the thin film transistor 300C is higher than the intensity of visible light incident on the semiconductor layer 10B of the thin film diode 300B, but the intensity of infrared rays incident on the semiconductor layers 10A and 10C is lower than the intensity of infrared rays incident on the semiconductor layer 10B.

According to the present embodiment, the following merits can be attained.

In order to reduce the off-current of the thin film transistor 300C, it is necessary to suppress the amount of light incident on the semiconductor layer 10C as small as possible. In the example shown in FIG. 6, the thickness D3 of the insulating film 14 is equal to the thickness D1. The thickness D1 is set so that the reflectance R with respect to the visible light is high and the reflectance R with respect to the infrared rays is low, for example. Accordingly, the intensity of the infrared rays incident on the semiconductor layer 10C from the side of the insulating film 14 due to the multiple reflection is low. Therefore, the off-current due to the light incident on the semiconductor layer 10C can be reduce in the case where the off-current caused by the infrared rays incident on the semiconductor layer 100 is more serious than the off-current caused by the visible light.

Figure 7:
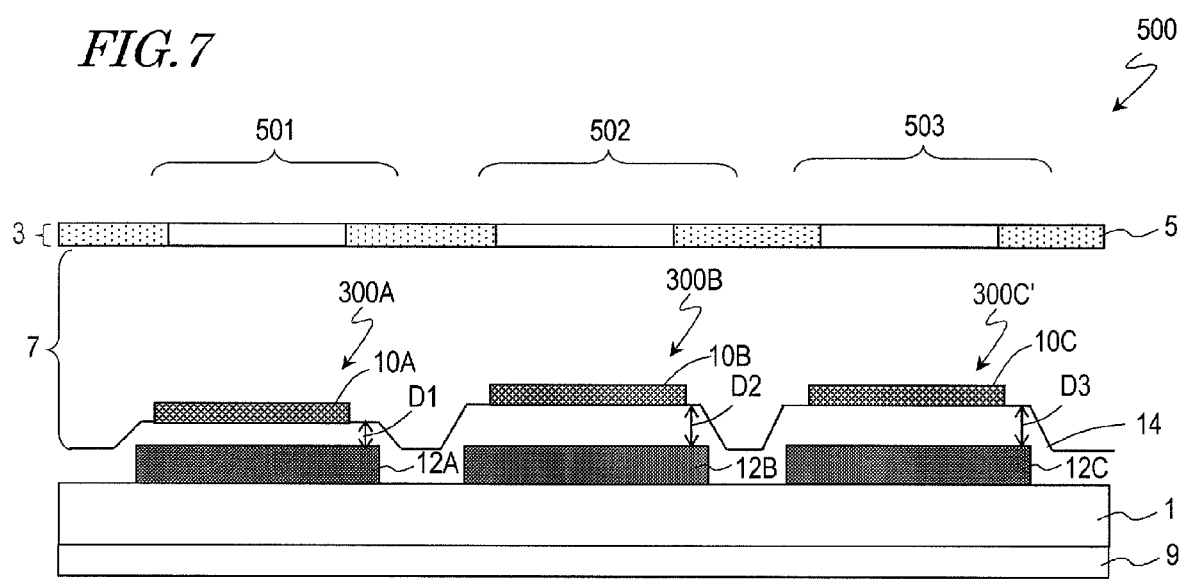
FIG. 7 is a schematic sectional diagram showing two thin film diodes and a thin film transistor in another semiconductor device in the second embodiment of the present invention.

FIG. 7 is a schematic sectional diagram showing another example of the semiconductor device in this embodiment. In a semiconductor device 500 shown in FIG. 7, a thickness D3 of an insulating film 14 between a semiconductor layer 10C and a light blocking layer 12C of a thin film transistor 300C' is equal to the thickness D2 of the insulating film 14 between the semiconductor layer 10B and the light blocking layer 12B of the thin film diode 300B. The thickness D2 is set so that the reflectance R with respect to the infrared rays is high and the reflectance R with respect to the visible light is low, for example.

The reflectance of the thin film diode 300A and the reflectance of the thin film diode 300B in the semiconductor device 300 are similar to the reflectance of the thin film diode 100A and the reflectance of the thin film diode 100B, respectively, shown in FIG. 2(a) and FIG. 2(b). Herein "the light in the first wavelength region" shown in FIG. 2(a) includes visible light, and "the light in the second wavelength region" shown in FIG. 2(b) includes infrared rays. The reflectance of the thin film transistor 300C' is similar to the reflectance of the thin film diode 300B.

Accordingly, the intensity of infrared rays incident on the semiconductor layers 10B and 10C of the thin film diode 300B and the thin film transistor 300C' is higher than the intensity of infrared rays incident on the semiconductor layer 10A of the thin film diode 300A. However, the intensity of visible light incident on the semiconductor layers 10B and 10C is lower than the intensity of visible light incident on the semiconductor layer 10A.

As described above, in the thin film transistor 300C' shown in FIG. 7, the intensity of visible light incident on the semiconductor layer 10C from the side of the insulating film 14 is lowered due to multiple reflection. Accordingly, it is possible to reduce the off-current due to the light incident on the semiconductor layer 10C in the case where the off-current caused by the visible light incident on the semiconductor layer 10C is more serious than the off-current caused by the infrared rays.

It is sufficient that the thickness D3 is set so as to suppress the sensitivity to light of a specific wavelength which more greatly affects the off-current (photo leakage current) of the thin film diode 300C' and to effectively reduce the off-current. Accordingly, the thickness D3 may be different from both of the thicknesses D1 and D2 of the insulating film 14 in the thin film diode. However, as shown in FIG. 6 and FIG. 7, the thickness D3 is preferably equal to either one of the thicknesses D1 and D2. With such a configuration, the off-current can be reduced as compared with the prior art without complicating the production process.

The thin film transistors 300C and 300C' in the present embodiment may have a single drain structure, or may alternatively have an LDD (Lightly Doped Drain) structure or a GOLD (Gate-Overlapped LDD) structure. The shape and the position of the light blocking layer 12C may be appropriately selected so that light is not incident on the semiconductor layer 10C (at least the channel region of the semiconductor layer 10C) from the side of the substrate 1.

In the present embodiment, the light blocking layers 12A, 12B, and 12C are preferably formed by patterning one and the same light blocking film. In addition, the semiconductor layers 10A, 10B, and 10C are preferably formed by patterning one and the same semiconductor film (e.g., a poly-silicon film). Accordingly, the thin film diodes 300A and 300B and the thin film transistor 300C (or the thin film transistor 300C') can be fabricated on one and the same substrate without increasing the number of production processes.

Third Embodiment

In the present embodiment, a display device provided with a sensor function. The display device is configured by using a semiconductor device of any one of the above-described embodiments.

The display device provided with the sensor function in the present embodiment is, for example, a liquid crystal display device with a touch sensor which includes a display area and a frame area located around the display area. The display area has a plurality of display portions (pixels) and a plurality of optical sensor portions. Each display portion includes a pixel electrode and a pixel switching TFT, and each optical sensor portion includes two types of optical sensors for mutually different wavelength regions to be detected. Each optical sensor includes a TFD. In the frame area, a driving circuit for display is provided so as to drive each display portion, and a TFT for a driving circuit is utilized for the driving circuit. The pixel switching TFT and the TFT for a driving circuit, and the TFD of the optical sensor portion are formed on one and the same substrate. In the display device of the present invention, it is sufficient that at least the pixel switching TFT among the TFTs used in the display device may be formed on one and the same substrate on which the TFD of the optical sensor portion is formed by the above-described method. For example, the driving circuit may be separately provided on another substrate.

In the present embodiment, the optical sensor portion is disposed adjacent to a corresponding display portion (e.g., a pixel of primary color). For one display portion, one optical sensor portion may be disposed, or a plurality of optical sensor portions may be disposed.

Alternatively, for each set of a plurality of display portions, one optical sensor portion may be disposed. For example, for a color display pixel constituted by pixels of three primary colors (RGB), one optical sensor portion can be provided. As described above, the number (the density) of optical sensor portions for the number of display portions can be appropriately selected in accordance with the resolution.

If the color filters are provided on the side of an observer of the optical sensor portion, the sensitivity of the TFD which constitutes the optical sensor portion may disadvantageously be degraded, so that it is preferred that the color filters may not be provided on the side of the observer of the optical sensor portion.

In the case where the intensity of illumination of ambient light is high, the optical sensor portion of this embodiment detects the shadow of an object which is in contact with or comes closer to the screen (a finger pulp or the like) by utilizing the ambient light. In the case where the intensity of illumination of ambient light is low, the optical sensor portion detects infrared rays which are emitted from the backlight and then reflected from the object.

Hereinafter with reference to the drawings, the configuration of the display device in this embodiment will be described by way of an example of a touch panel liquid crystal display device provided with a touch panel sensor.

Figure 8:
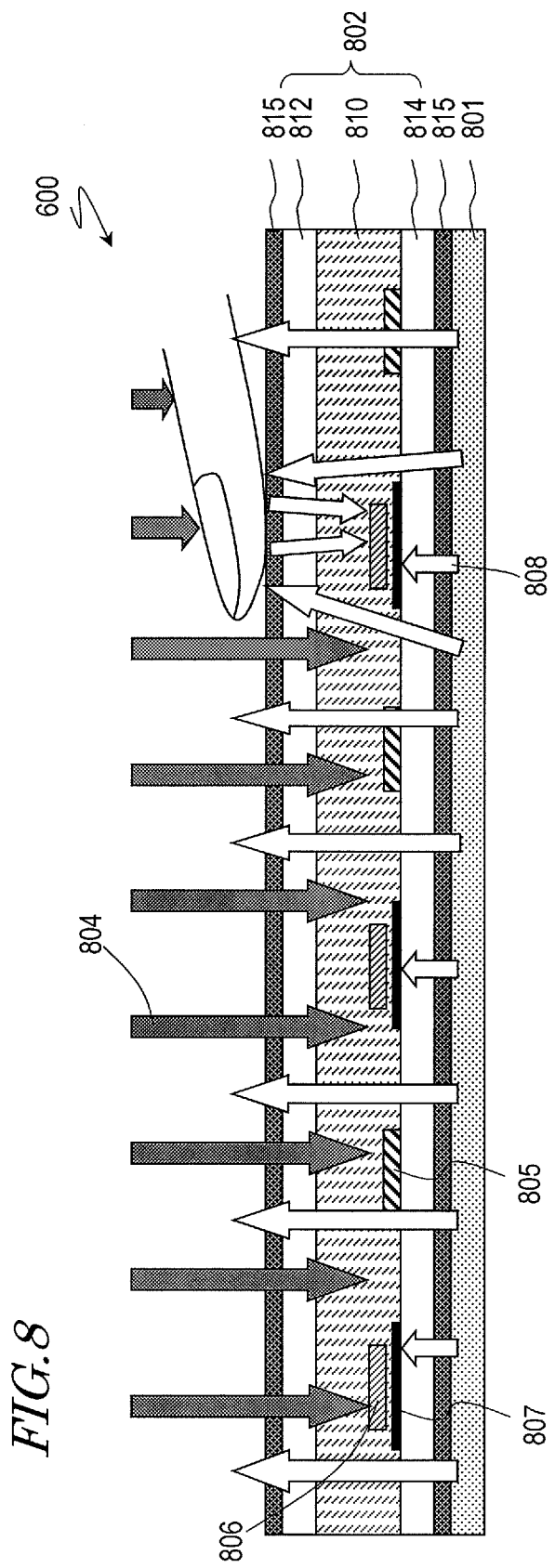
FIG. 8 is a configuration diagram of an optical sensor type touch panel in a third embodiment of the present invention.

FIG. 8 is a schematic sectional diagram showing an example of an active matrix type touch panel liquid crystal display device.

A liquid crystal display device 600 includes a liquid crystal module 802, a backlight 801 disposed on the rear side of the liquid crystal module 802. The liquid crystal module 802 is constituted by a rear substrate 814 with translucency, a front substrate 812 disposed opposite to the rear substrate 814, and a liquid crystal layer 810 provided between the substrates 814 and 812. The liquid crystal module 802 has a plurality of display portions (pixels of primary colors). Each of the display portions has a pixel electrode (not shown) and a pixel switching thin film transistor 805 connected to the pixel electrode. An optical sensor portion including a thin film diode 806 is disposed adjacent to the respective color display pixel constituted by the display portions of three primary colors (RGB). Alternatively, one optical sensor portion may be disposed for two adjacent color display pixels (six display portions). Although being omitted in this figure, the optical sensor portion includes at least one first sensor which includes the thin film diode 806 and detects visible light with high sensitivity and at least one second sensor which includes another thin film diode (not shown) and detects visible light with high sensitivity.

Color filters (not shown) are disposed on the side of the observer of each display portion, but color filters are not disposed on the side of the observer of the optical sensor portion. A light blocking layer 807 is disposed between the thin film diode 806 and the backlight 801. Accordingly, light 808 from the backlight 801 is blocked by the light blocking layer 807, so that it is not incident on the thin film diode 806 from the back side (i.e., from the side of the rear substrate 814). It is sufficient that the light blocking layer 807 may be disposed in such a manner that the light from the backlight 801 is not incident on an intrinsic region of the thin film diode 806.

In the optical sensor portion, the first sensor including the thin film diode 806 and the second sensor including another thin film diode are connected in parallel. The first sensor performs the sensing of ambient light (visible light) 804. On the other hand, the second sensor performs the sensing of light of the light (infrared rays) 808 from the backlight 801 which is reflected from a finger pulp or the like after passing through the liquid crystal module 802.

Figure 9:
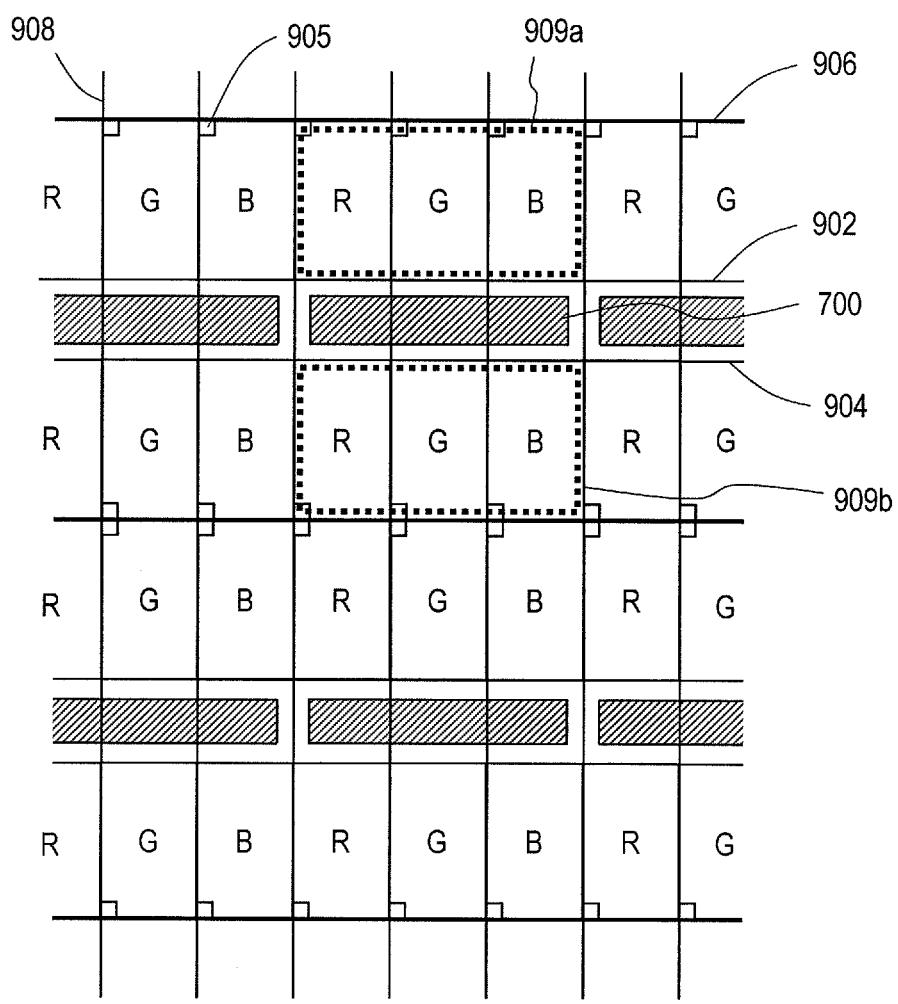
FIG. 9 is a schematic plan diagram exemplarily showing a rear substrate in a touch panel type liquid crystal display device in the third embodiment of the present invention.

FIG. 9 is a schematic plan view showing the rear substrate 814 of the display device in this embodiment. In the example shown in the figure, one optical sensor portion is provided for two color display pixels of R, G, and B pixels.

The rear substrate 814 in this embodiment is provided with a plurality of R, G, and B pixels arranged in a matrix and a plurality of optical sensor portions 700. Each pixel has a pixel switching thin film transistor 905 and a pixel electrode (not shown). Herein sets of pixels 909a and 909b constituted by adjacent R, G, and B pixels are referred to as "color display pixels." In this embodiment, one optical sensor 700 is disposed for adjacent two color display pixels 909a and 909b.

The thin film transistor 905 has a dual gate LDD structure including, for example, two gate electrodes and an LDD region. A source region of the thin film transistor 905 is connected to a source bus line 908 for pixel, and a drain region thereof is connected to a pixel electrode. The thin film transistor 905 is turned on and off in accordance with a signal from a gate bus line 906 for pixel. Accordingly, a voltage is applied across a liquid crystal layer by the pixel electrode and a counter electrode formed on a front substrate disposed opposite to the rear substrate, and the alignment condition of the liquid crystal layer is changed, thereby performing the display.

In this embodiment, an RST signal line 902 and an RWS signal line 904 are provided between adjacent two gate wirings 906. These lines 902 and 904 are formed by one and the same layer as the gate wiring 906. The optical sensor portion 700 is disposed between these lines 902 and 904.

In FIG. 10(a) and FIG. 10(b) are a circuit diagram and a plan view for illustrating the configuration of the optical sensor portion 700 in this embodiment, respectively.

As shown in FIG. 10(a), the optical sensor portion 700 includes thin film diodes 701A and 701B, signal holding capacitors 702A and 702B, and a signal taking-out thin film transistor 703. The thin film diodes 701A and 701B and the thin film transistor 703 are disposed in regions defined by the source bus lines 908, and the RWS signal line 904 and the RST signal line 902, respectively.

As is seen from FIG. 10(b), the thin film diode 701A is provided with a semiconductor layer including a p-type region 710p, an n-type region 710n, and an intrinsic region 710i positioned between these regions 710p and 710n. The thin film diode 701B is provided with a semiconductor layer including a p-type region 711p, an n-type region 711n, and an intrinsic region 711I positioned between these regions 711p and 711n. Below the thin film diode 701A and the thin film diode 701B, light blocking layers are disposed, respectively, via an insulating film. The diodes 701A and 701B have the same configurations as those of the thin film diodes 100A and 100B shown in FIG. 1, respectively.

The signal holding capacitors 702A and 702B are configured by using the gate electrode layer and the semiconductor layer as their electrodes, and the capacitance is formed by a gate insulating film.

The p-type region 710p in the thin film diode 701A is connected to the RST signal line 902, and n-type region 710n is connected to a lower electrode (an Si layer) in the signal holding capacitor 702A through which the n-type region 710n is connected to the RWS signal line 904. Similarly, the p-type region 711p in the thin film diode 701B is connected to the RST signal line 902, and the n-type region 711n is connected to a lower electrode (an Si layer) in the signal holding capacitor 702B through which the n-type region 711n is connected to the RWS signal line 904. Moreover, the n-type regions 710n and 711n are connected to a gate electrode layer in the signal taking-out thin film transistor 703. A source region of the signal taking-out thin film transistor 703 is connected to a VDD signal line $908_{VDD}$, and a drain region thereof is connected to an output signal line $908_{COL}$. The signal lines $908_{VDD}$, and $908_{COL}$ also function as source bus lines.

Next, the operation in optical sensing by the optical sensor portion 700 will be described.

(1) First, by the RWS signal line 904, an RWS signal is written into the signal holding capacitors 702A and 702B. Thus, plus electric fields are generated on the side of the n-type regions 710n and 711n in the optical sensor thin film diodes 701A and 701B, respectively, so as to be reverse bias condition with respect to the thin film diodes 701A and 701B.

(2) If photo leakage occurs in at least one of the thin film diodes 701A and 701B, charges are released to the side of the RST signal line 902 via the thin film diode. At this time, if photo leakage occurs in only one of the thin film diodes, the current flows via the thin film diode only. If photo leakage occurs in both of the thin film diodes, the current flows mainly via one of the thin film diodes with larger photo leakage.

(3) Accordingly, the potential on the side of the n-type regions 710n and 711n lowers, and the gate voltage applied across the signal taking-out thin film transistor 703 is varied in accordance with the potential change.

(4) A VDD signal is applied from the VDD signal line $908_{VDD}$ on the source side of the signal taking-out thin film transistor 703. When the gate voltage is varied as described above, the current value flowing to the output signal line $908_{COL}$ connected to the drain side is varied, so that the electrical signal can be taken out from the output signal line $908_{COL}$.

(5) Thereafter, a current is caused to flow in the forward direction from the output signal line $908_{COL}$ to the thin film diodes 701A and 701B, and the RST signal is written into the signal holding capacitors 702A and 702B, so as to reset the potential of the signal holding capacitors 702A and 702B. At this time, the reset can be performed via one of the thin film diodes 701A and 701B with higher current driving force.

The operations of (1) through (5) are repeated while performing the scanning, so that optical sensing by utilizing the ambient light and the light from the backlight can be performed.

The configuration of the rear substrate in the touch panel liquid crystal display device in this embodiment is not limited to that shown in FIG. 9. For example, a storage capacitor (Cs) may be disposed in each pixel switching TFT. In the example shown in FIG. 9, one optical sensor portion is provided for two color display pixels (two pixel sets of RGB pixels). Alternatively, one optical sensor portion may be disposed for one color display pixel. Alternatively, in order to further increase the resolution, one optical sensor portion may be provided for each RGB pixels. However, in such a case, the aperture ratio is significantly reduced, so that there is a possibility that the brightness of display may be reduced.

The semiconductor device in this embodiment is not limited to the touch panel liquid crystal display device, but may be a display device with an image sensor function or a fingerprint sensor function. The above-described optical sensor portion 700 can be used as an image sensor or a fingerprint sensor. In the case where the optical sensor portion 700 is used as the image sensor or the fingerprint sensor, in order to detect an image or fingerprints which are pressed against the screen, higher resolution is generally required than the touch sensor. The resolution is increased in accordance with the increase in number of optical sensor portions for the pixels. For this reason, the number of optical sensor portions can be appropriately adjusted in accordance with the application. As is shown in FIG. 9, if one optical sensor portion is disposed for two color display pixels, it is possible to ensure sufficient resolution with which an image such as a name card can be read. In addition, if a color filter is disposed on the side of an observer of the optical sensor portion and light passing through the color filter is received by the optical sensor portion, the optical sensor portion can function as a color image sensor.

In this embodiment, one optical sensor portion is constituted by connecting two thin film diodes with different wavelength regions of light to be detected in parallel. Alternatively, the two thin film diodes are not connected in parallel, but they may be used as two optical sensors functioning independently.

As described above, the specific embodiments of the present invention have been described, but the present invention is not limited to the above-described embodiments. Various modifications based on the technical idea of the present invention can be realized. For example, the semiconductor device of the present invention is not limited to a display device provided with an optical sensor portion, but may be an image sensor. Hereinafter the configuration of an image sensor to which the present invention is applied will be briefly described.

The image sensor is provided with a plurality of light receiving portions arranged in two dimensions, and an image information generating portion for generating image information. Each of the light receiving portions may have the same configuration as that of the display portion (the pixel) shown in FIG. 9 and FIG. 10. Each of the light receiving portions may be constituted by three pixels (RGB pixels). Each of the light receiving portions includes the above-described optical sensor portion 700. The image information generating portion generates image information related to a sensing signal generated in the optical sensor portion 700 in each light receiving portion and the position of the corresponding light receiving portion. Accordingly, the image read by the image sensor can be formed or certificated.

INDUSTRIAL APPLICABILITY

The present invention can be widely applied to a semiconductor device provided with an optical sensor portion utilizing a TFD, or electronic equipment in various fields including such a semiconductor device. For example, the present invention may be applied to a CMOS circuit or a pixel portion in an active matrix liquid crystal display device or an organic EL display device. Such a display device can be utilized as, for example, a display screen of a portable phone or a portable video game, a monitor of a digital camera, or the like. Accordingly, the present invention can be applied to any electronic equipment in which a liquid crystal display device or an organic EL display device is incorporated.

The present invention can be particularly applied suitably to a display device such as an active matrix liquid crystal display device and an organic EL display device, an image sensor, an optical sensor, or electronic equipment in which they are combined. Especially, it is advantageous that the present invention may be applied to a display device provided with an optical sensor function utilizing a TFD, for example, a display device provided with both of a touch panel function and a scanner function.

REFERENCE SIGNS LIST

1 substrate
3 counter substrate
5 CF light blocking portion
7 liquid crystal layer
9 backlight
10A, 10B semiconductor layer of thin film diode
10C semiconductor layer of thin film diode
10pA, 10pB P-type region
10nA, 10nB N-type region
101A, 10iB intrinsic region
12A, 12B, 12C light blocking layer
14 insulating film
100A, 100B, 300A, 300B thin film diode
300C, 300C' thin film transistor
200, 400, 500 semiconductor device
201, 202 sensor
401 visible light sensor
402 infrared-ray sensor

The invention claimed is:
1. A semiconductor device comprising:
a substrate; and
a first thin film diode and a second thin film diode supported by the substrate, wherein
the first thin film diode includes a first semiconductor layer and a first light blocking layer disposed on the substrate side of the first semiconductor layer,
the second thin film diode includes a second semiconductor layer and a second light blocking layer disposed on the substrate side of the second semiconductor layer,
an insulating film is formed between the first semiconductor layer and the first light blocking layer and between the second semiconductor layer and the second light blocking layer,
a thickness D1 of a portion of the insulating film positioned between the first semiconductor layer and the first light blocking layer is different from a thickness D2 of a portion of the insulating film positioned between the second semiconductor layer and the second light blocking layer,
light in a first wavelength region and light in a second wavelength region including a wavelength larger than the maximum wavelength of the first wavelength region are incident on the first and the second semiconductor layers, and the first and the second light blocking layers have surfaces for reflecting the light in the first and the second wavelength regions,
the intensity of light in the first wavelength region incident on the first semiconductor layer is higher than the intensity of light in the first wavelength region incident on the second semiconductor layer, and
the intensity of light in the second wavelength region incident on the second semiconductor layer is higher than the intensity of light in the second wavelength region incident on the first semiconductor layer.

2. The semiconductor device of claim 1, wherein the thickness D1 of the portion of the insulating film positioned between the first semiconductor layer and the first light blocking layer is smaller than the thickness D2 of the portion of the insulating film positioned between the second semiconductor layer and the second light blocking layer.

3. The semiconductor device of claim 1, wherein the light in the first wavelength region includes visible light, and the light in the second wavelength region includes infrared rays.

4. The semiconductor device of claim 1, wherein the first semiconductor layer and the second semiconductor layer are formed by using one and the same semiconductor film.

5. The semiconductor device of claim 2, wherein the insulating film includes:
   a lower film, made from a first insulating material, which is formed to cover the first and the second light blocking layers; and
   an upper film, made from a second insulating film which is different from the first insulating material, which is formed on the lower film to cover the second light blocking layer but not to cover the first light blocking layer.

6. The semiconductor device of claim 2, wherein the insulating film includes:
   a lower film, made from a first insulating material, which is formed to cover the second light blocking layer but not to cover the first light blocking layer, and
   an upper film, made from a second insulating material which is the same as or different from the first insulating material, which is formed on the lower film to cover the first and the second light blocking layers.

7. The semiconductor device of claim 1, wherein the thickness D1 and the thickness D2 are determined respectively in such a manner that
   the ratio RA(1) of the intensity of light in the first wavelength region incident on the first semiconductor layer from the side of the insulating film to the intensity of light in the first wavelength region incident on the insulating film after passing through the first semiconductor layer from above the substrate is higher than the ratio RB(1) of the intensity of light in the first wavelength region incident on the second semiconductor layer from the side of the insulating film to the intensity of light in the first wavelength region incident on the insulating film after passing through the second semiconductor layer from above the substrate, and
   the ratio RB(2) of the intensity of light in the second wavelength region incident on the second semiconductor layer from the side of the insulating film to the intensity of light in the second wavelength region incident on the insulating film after passing through the second semiconductor layer from above the substrate is higher than the ratio RA(2) of the intensity of light in the second wavelength region incident on the first semiconductor layer from the side of the insulating film to the intensity of light in the second wavelength region incident on the insulating film after passing through the first semiconductor layer from above the substrate.

8. The semiconductor device of claim 1, further comprising a thin film transistor supported by the substrate, wherein
   the thin film transistor includes a third semiconductor layer and a third light blocking layer disposed on the substrate side of the third semiconductor layer,
   the insulating film is formed between the third semiconductor layer and the third light blocking layer, and
   a thickness D3 of a portion of the insulating film positioned between the third semiconductor layer and the third light blocking layer is substantially equal to the thickness D1.

9. The semiconductor device of claim 1, further comprising a thin film transistor supported by the substrate, wherein
   the thin film transistor includes a third semiconductor layer and a third light blocking layer disposed on the substrate side of the third semiconductor layer,
   the insulating film is formed between the third semiconductor layer and the third light blocking layer, and
   a thickness D3 of a portion of the insulating film positioned between the third semiconductor layer and the third light blocking layer is substantially equal to the thickness D2.

\* \* \* \* \*